United States Patent [19]

Segawa et al.

[11] Patent Number: 5,409,847

[45] Date of Patent: Apr. 25, 1995

[54] MANUFACTURING METHOD OF CMOS TRANSISTOR IN WHICH HEAT TREATMENT AT HIGHER TEMPERATURE IS DONE PRIOR TO HEAT TREATMENT AT LOW TEMPERATURE

[75] Inventors: Mizuki Segawa, Kyoto; Yoshiaki Kato, Hyogo; Hiroaki Nakaoka, Osaka; Takashi Nakabayashi, Osaka; Atsushi Hori, Osaka; Hiroshi Masuda, Osaka; Ichiro Matsuo, Kyoto; Akihira Shinohara, Osaka; Takashi Uehara, Osaka; Mitsuo Yasuhira, Osaka, all of Japan

[73] Assignee: Matsushita Electric Industrial Co., Ltd., Osaka, Japan

[21] Appl. No.: 141,727

[22] Filed: Oct. 27, 1993

[51] Int. Cl.⁶ .......................................... H01L 21/265
[52] U.S. Cl. ...................................... 437/34; 437/44; 437/57; 437/247; 257/338; 257/351
[58] Field of Search ............... 437/34, 44, 57, 247; 257/338, 351

[56] References Cited

U.S. PATENT DOCUMENTS

| | | | |
|---|---|---|---|
| 4,530,150 | 7/1985 | Shirato | 29/576 B |
| 4,553,315 | 11/1985 | McCarty | 437/34 |
| 4,642,878 | 2/1987 | Maeda | 437/44 |
| 4,764,477 | 8/1988 | Chang et al. | 437/34 |
| 4,891,326 | 1/1990 | Koyanagi | 437/44 |
| 4,956,311 | 9/1990 | Liou et al. | 437/34 |
| 4,978,626 | 12/1990 | Poon et al. | 437/34 |
| 5,093,276 | 3/1992 | Asahina | 437/44 |
| 5,141,890 | 8/1992 | Haken | 437/44 |
| 5,166,087 | 11/1992 | Kakimoto et al. | 437/34 |
| 5,270,233 | 12/1993 | Hamatake | 437/44 |

*Primary Examiner*—Olik Chaudhuri
*Assistant Examiner*—Long Pham
*Attorney, Agent, or Firm*—Willian Brinks Hofer Gilson & Lione

[57] ABSTRACT

Gate electrodes of an N-channel transistor and a P-channel transistor are formed on a semiconductor substrate with a gate insulator therebetween. After conducting a first thermal treatment to the gate electrodes, N-type heavily doped diffusion layers to be a source or a drain of the N-channel transistor are formed using the gate electrode of the N-channel transistor as a mask. After conducting a second thermal treatment to the N-type heavily doped diffusion layers at a lower temperature than that of the first thermal treatment, P-type heavily doped diffusion layers to be a source or a drain of the P-channel transistor are formed using the gate electrode of the P-channel transistor as a mask. Then, a third thermal treatment is conducted to the P-type heavily doped diffusion layers at a lower temperature than that of the second thermal treatment.

4 Claims, 24 Drawing Sheets

| EMBODIMENT STEP | FIRST EMBODIMENT | MODIFICATION OF FIRST EMBODIMENT | SECOND EMBODIMENT | MODIFICATION OF SECOND EMBODIMENT | THIRD EMBODIMENT | MODIFICATION OF THIRD EMBODIMENT |
|---|---|---|---|---|---|---|
| GATE ELECTRODE | | | | | | |
| | | FIRST THERMAL TREATMENT | | FIRST THERMAL TREATMENT | | FIRST THERMAL TREATMENT |
| N-TYPE LIGHTLY DIFFUSION LAYER | | | | | | |
| | | | FIRST THERMAL TREATMENT | SECOND THERMAL TREATMENT | FIRST THERMAL TREATMENT | SECOND THERMAL TREATMENT |
| P-TYPE LIGHTLY DIFFUSION LAYER | | | | | | |
| SIDE WALL | | | | | | |
| N-TYPE HEAVILY DIFFUSION LAYER | | | | | | |
| | FIRST THERMAL TREATMENT | SECOND THERMAL TREATMENT | | | | |
| P-TYPE HEAVILY DIFFUSION LAYER | | | | | | |
| | SECOND THERMAL TREATMENT | THIRD THERMAL TREATMENT | SECOND THERMAL TREATMENT | THIRD THERMAL TREATMENT | SECOND THERMAL TREATMENT | THIRD THERMAL TREATMENT |

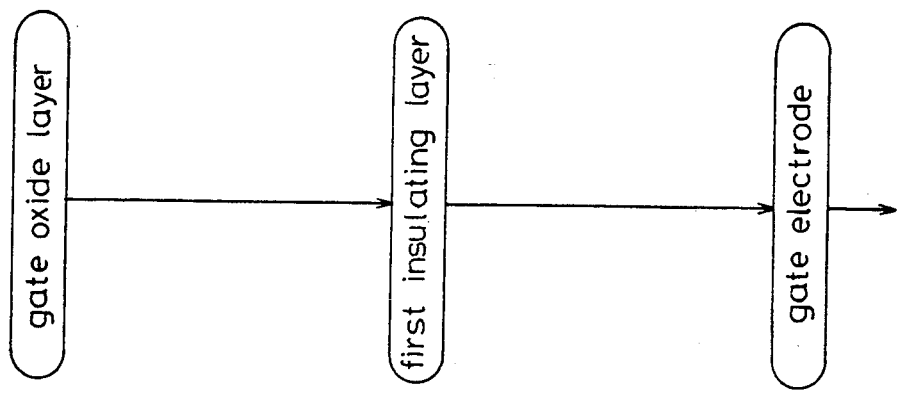
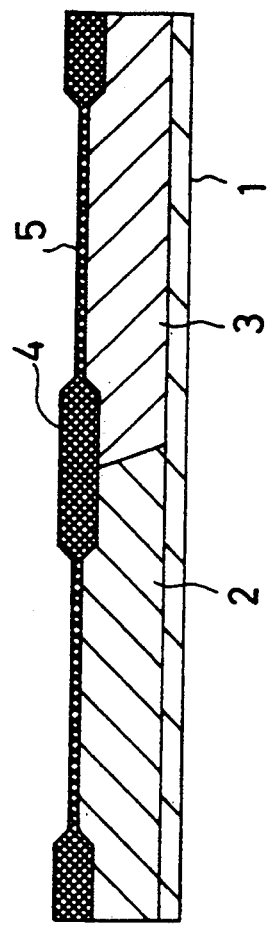
Fig.1(a)
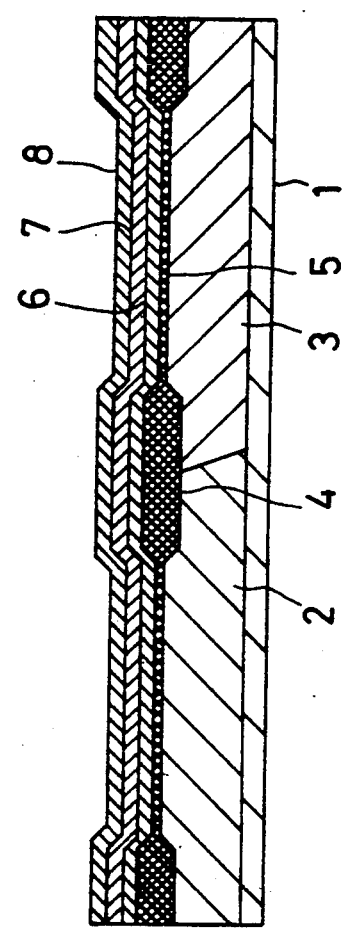
Fig.1(b)
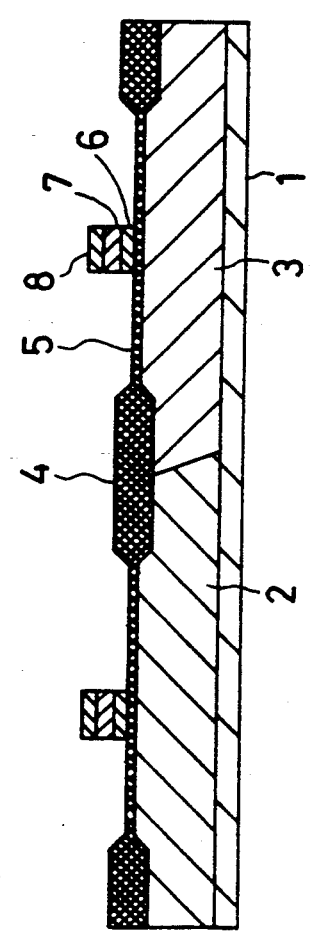
Fig.1(c)

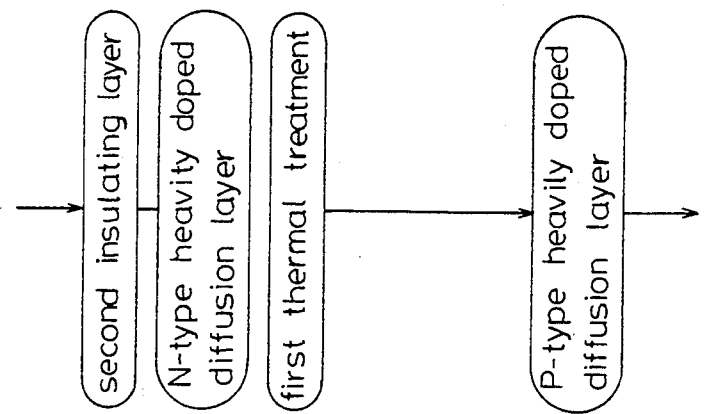
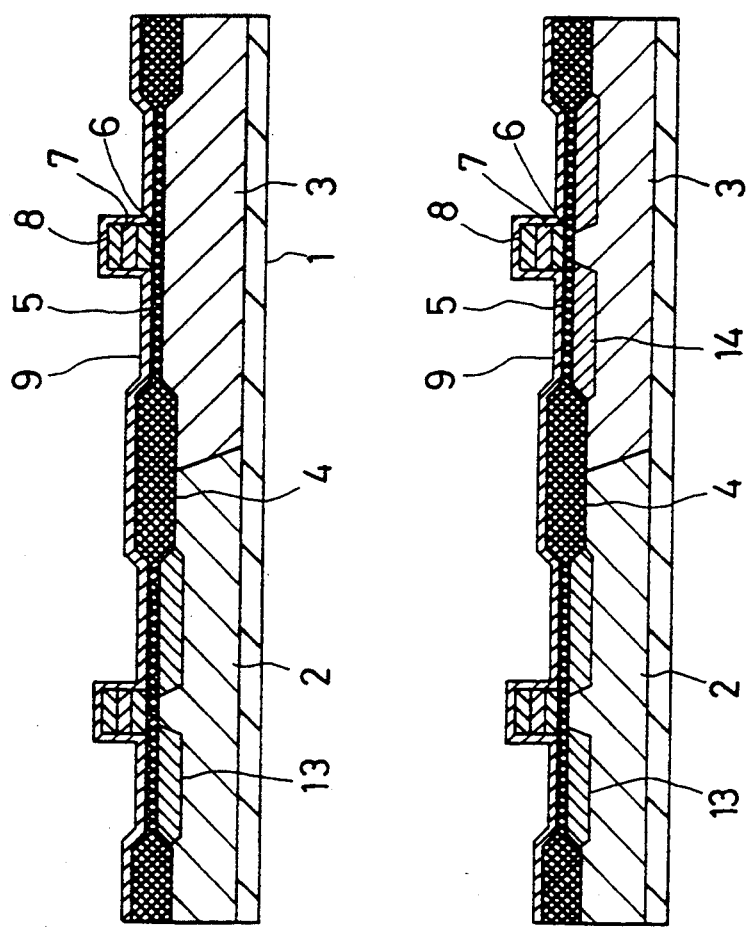
Fig.1(d)
Fig.1(e)

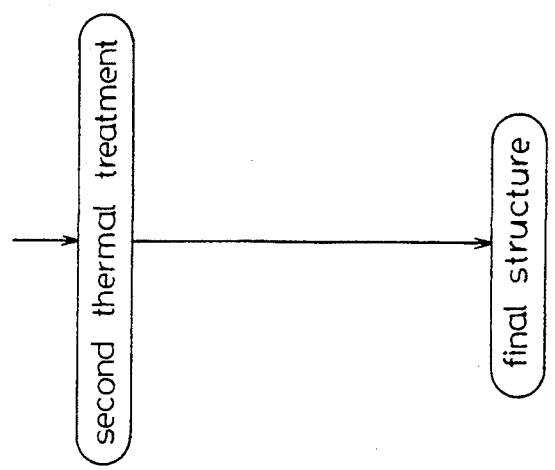
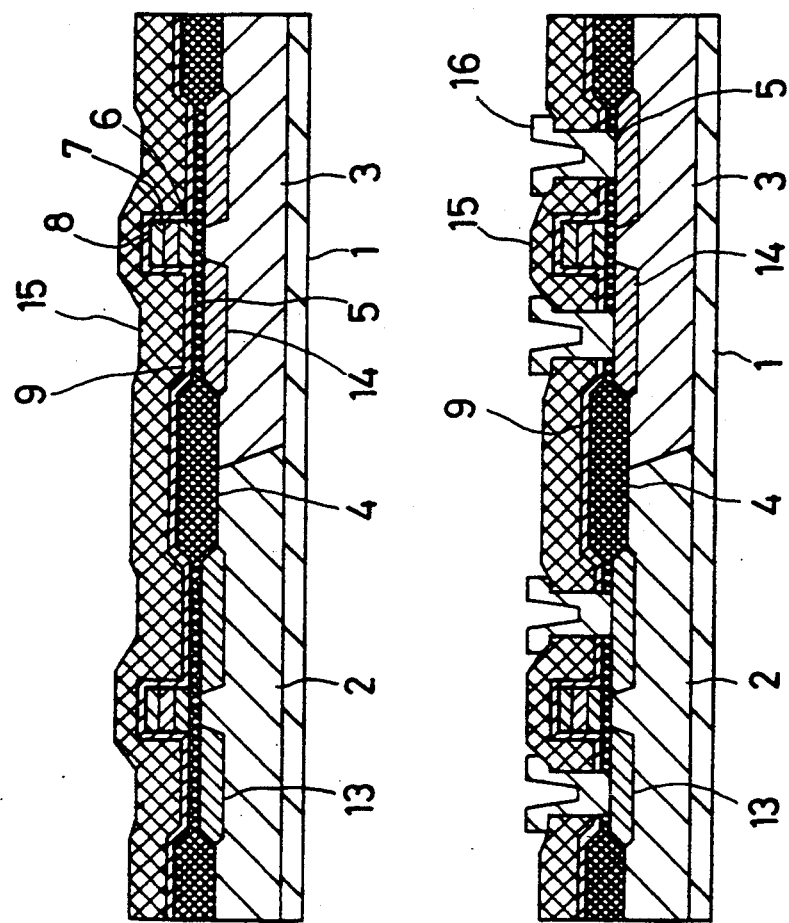
Fig.1(f)
Fig.1(g)

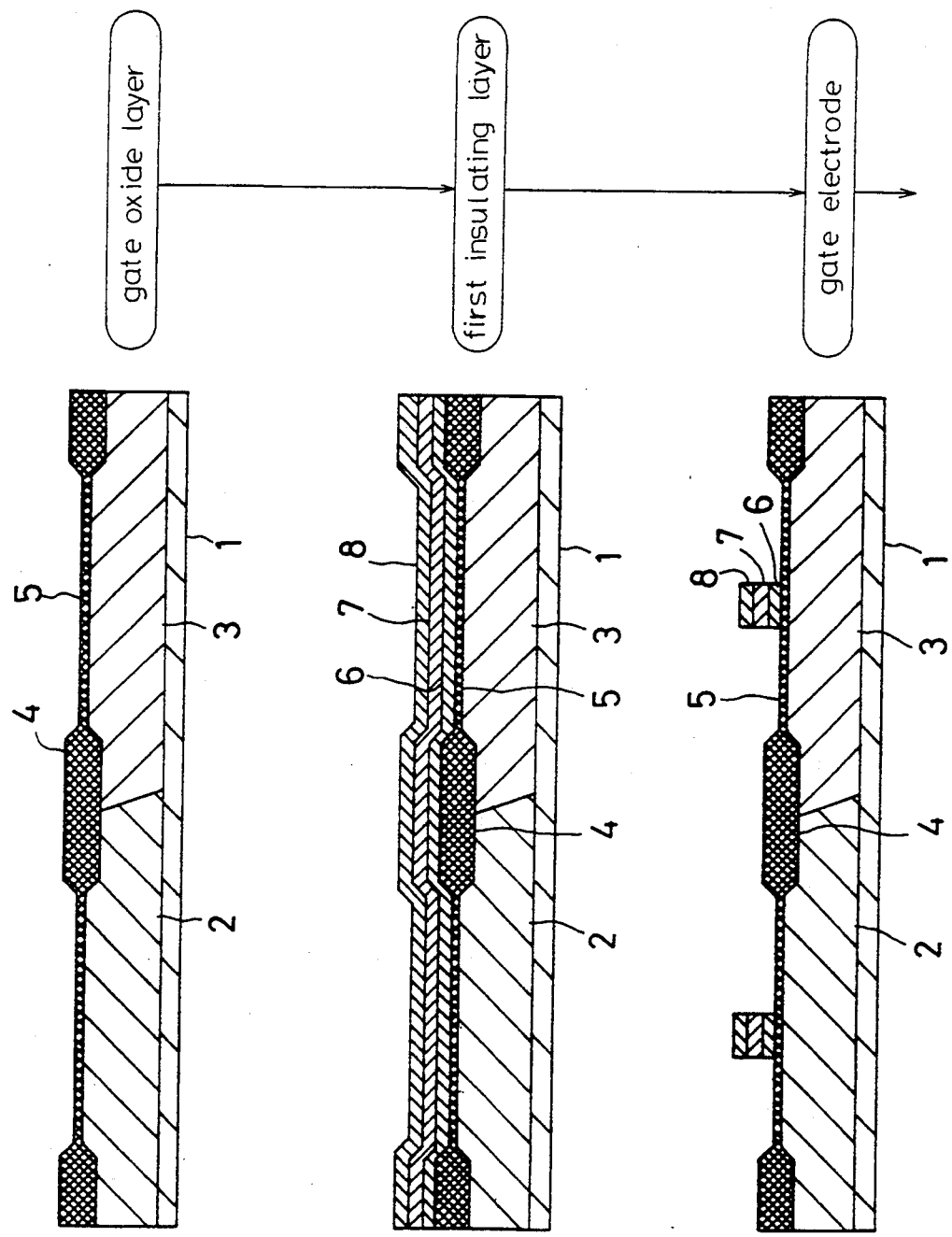

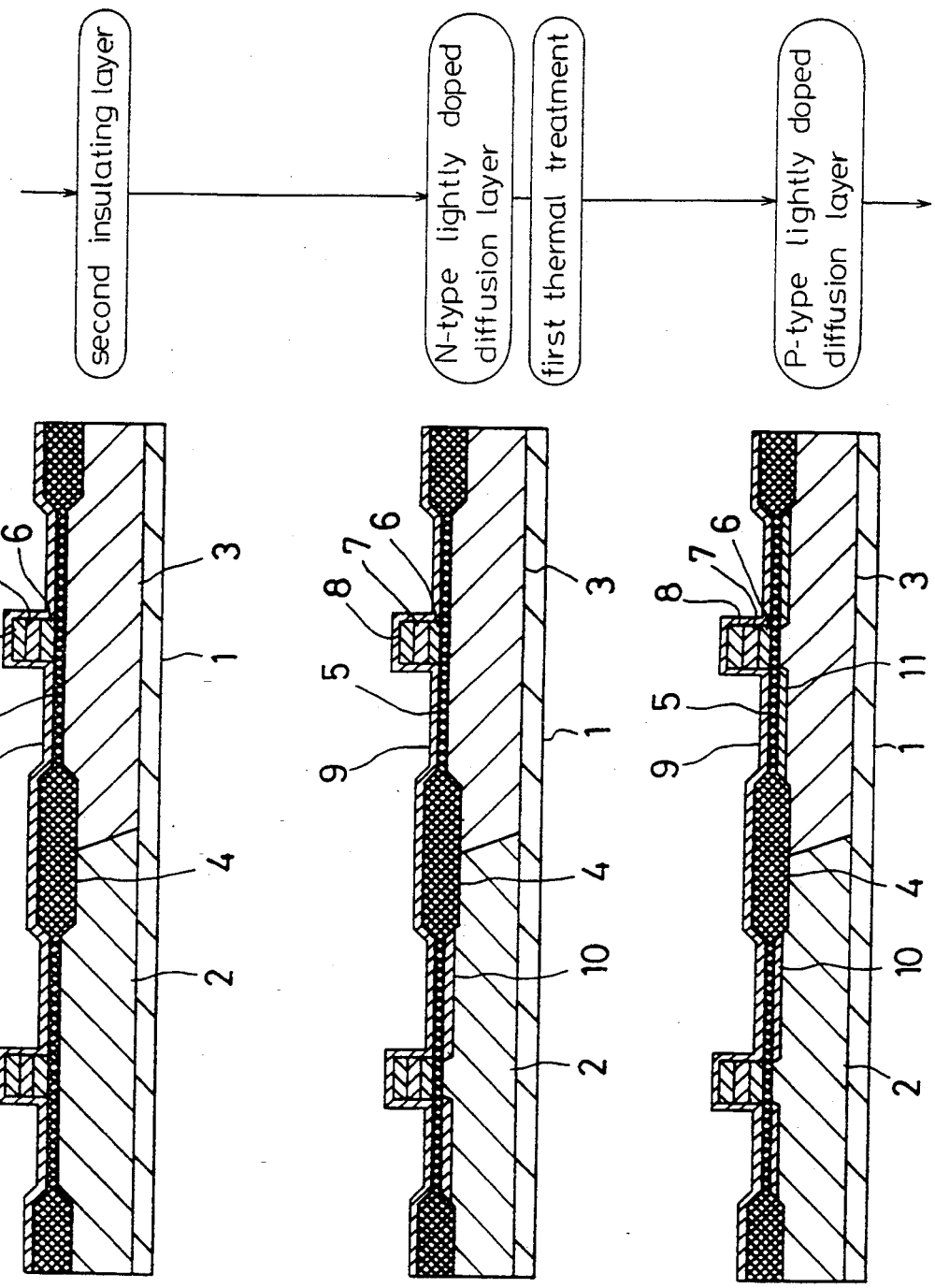

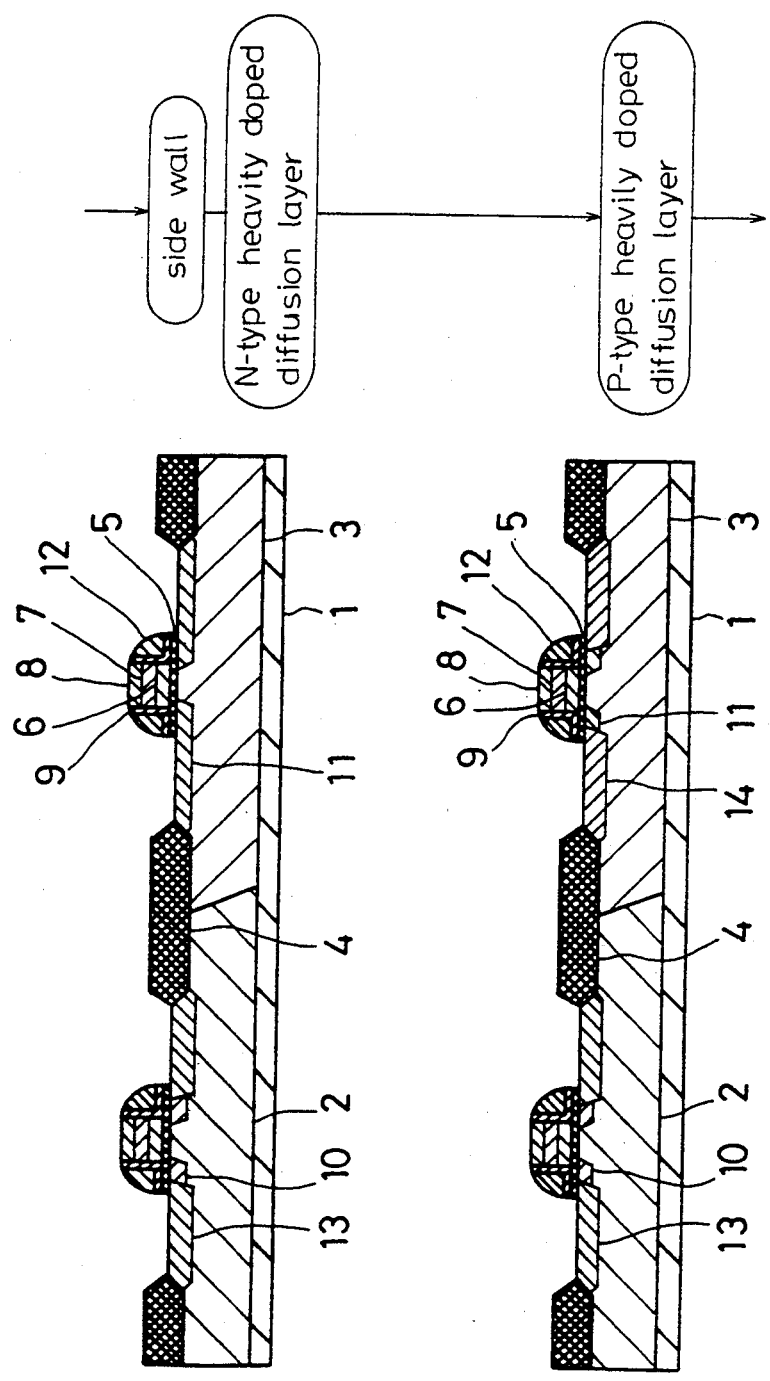

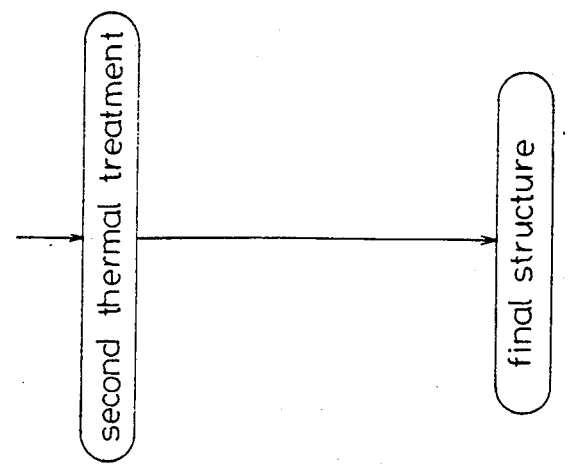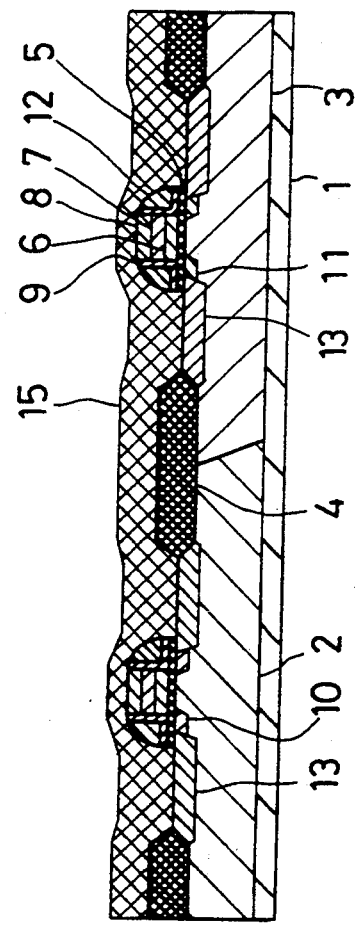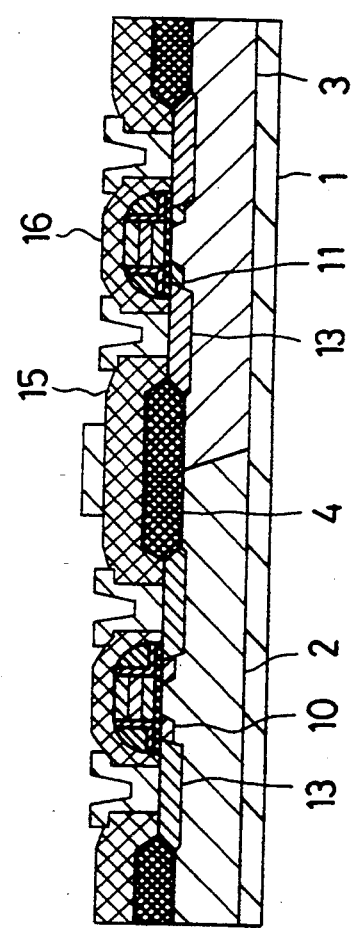

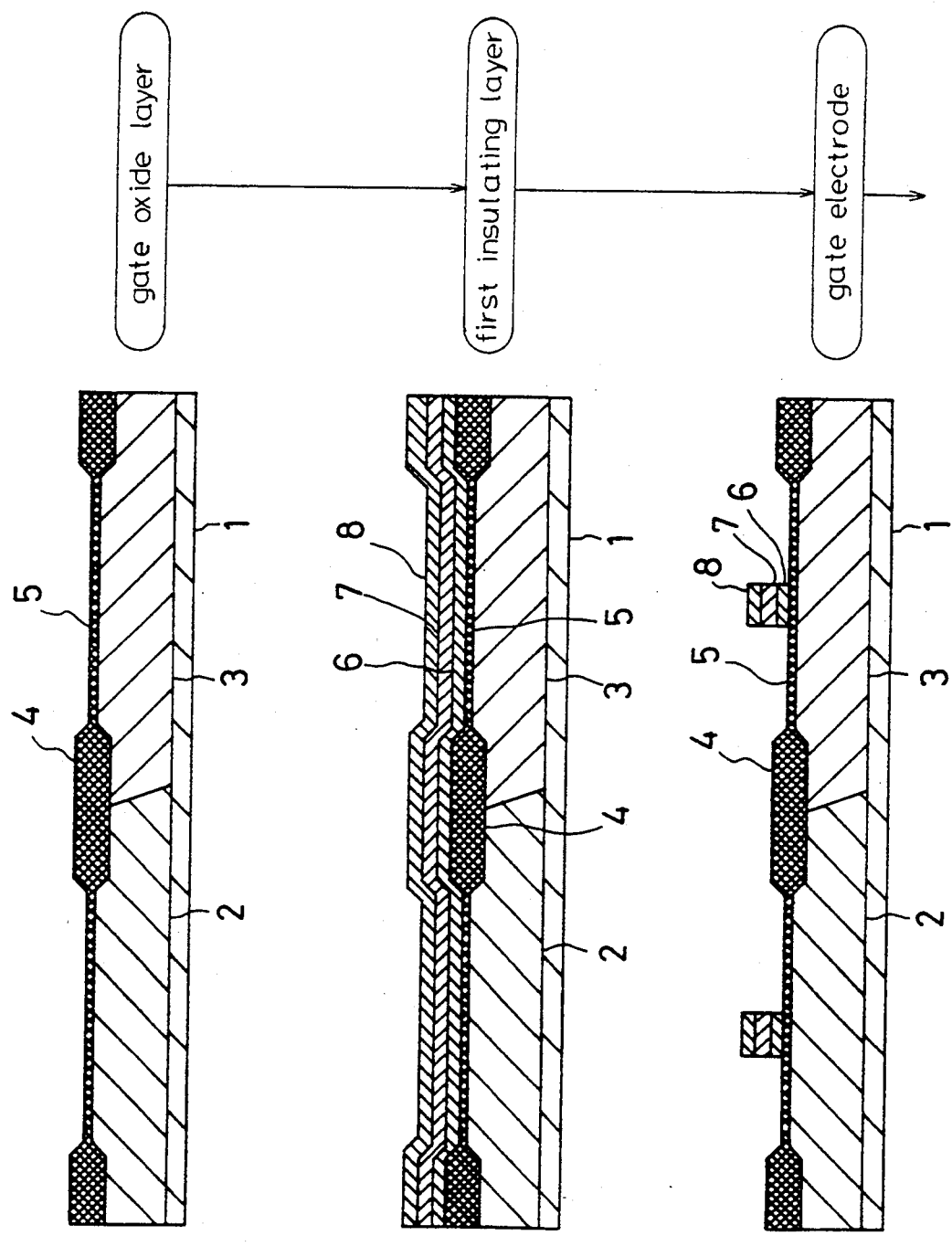

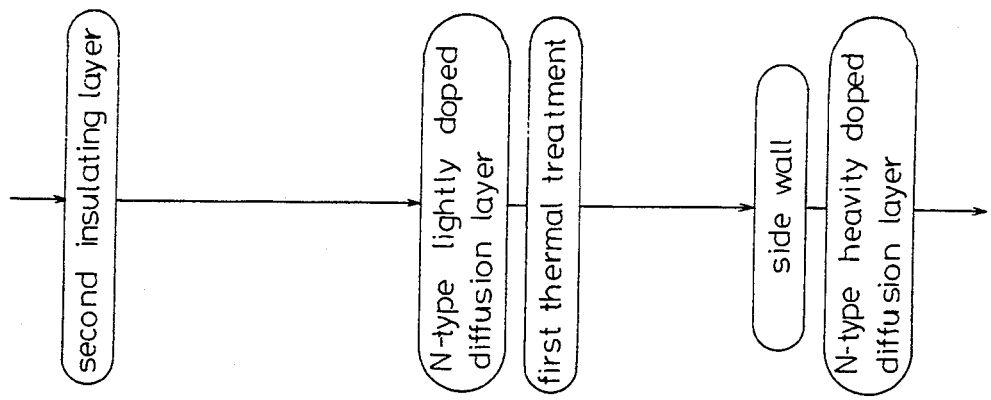
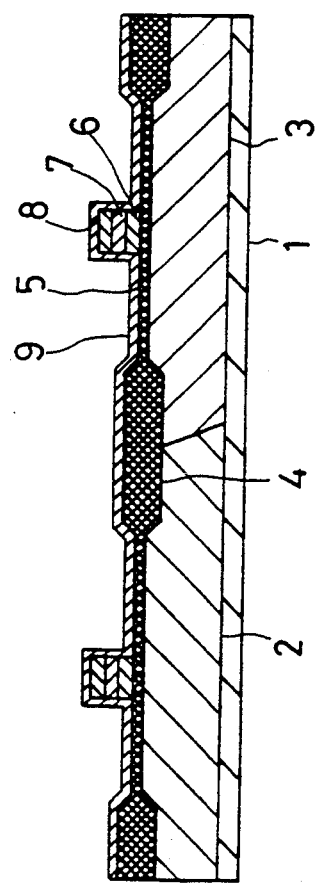
Fig.3(d)
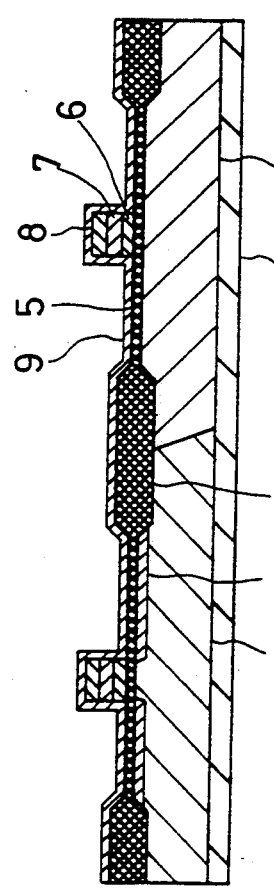
Fig.3(e)
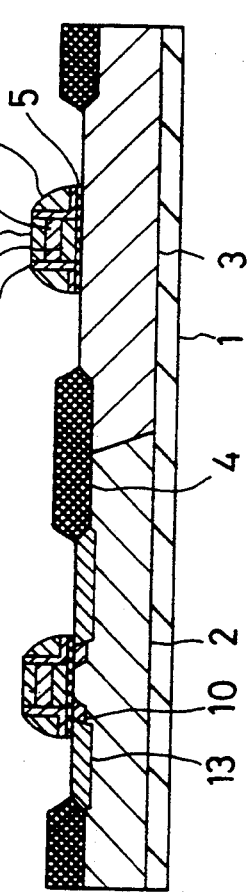
Fig.3(f)

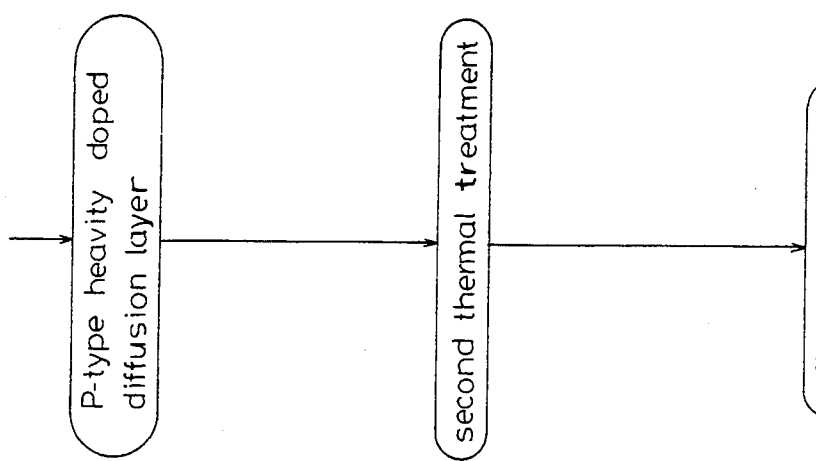
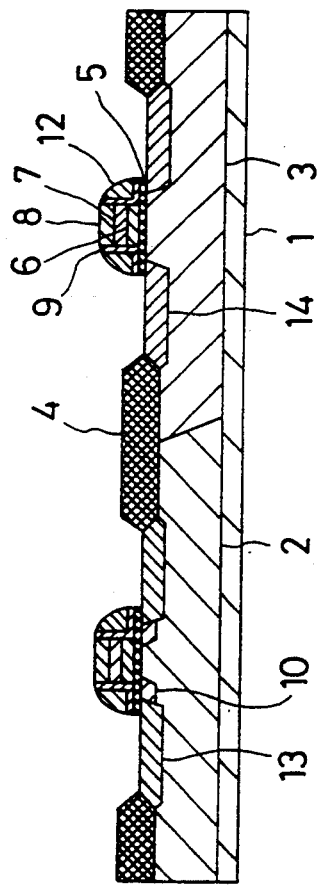
Fig.3(g)
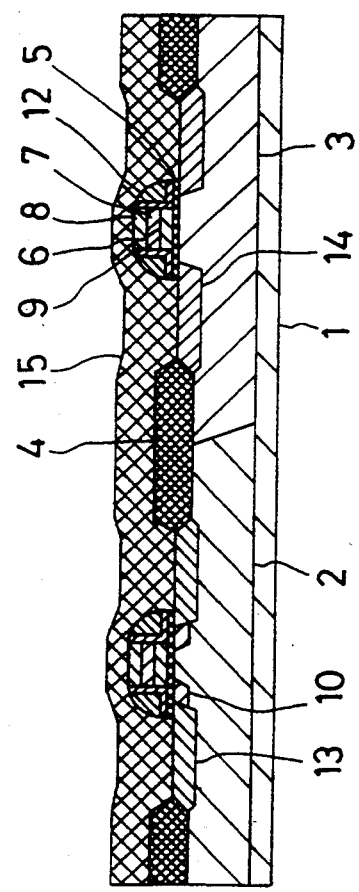
Fig.3(h)
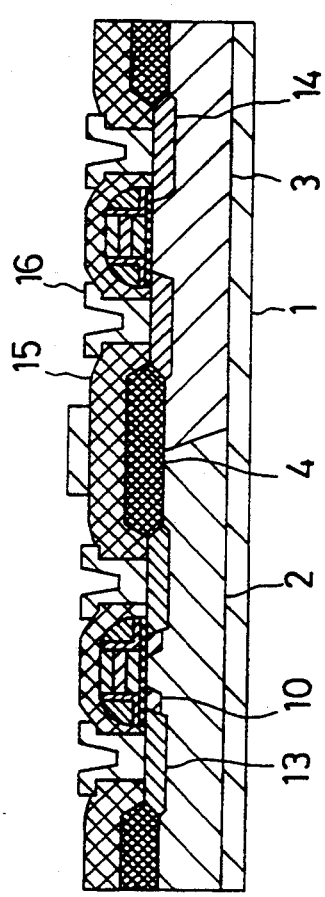
Fig.3(i)

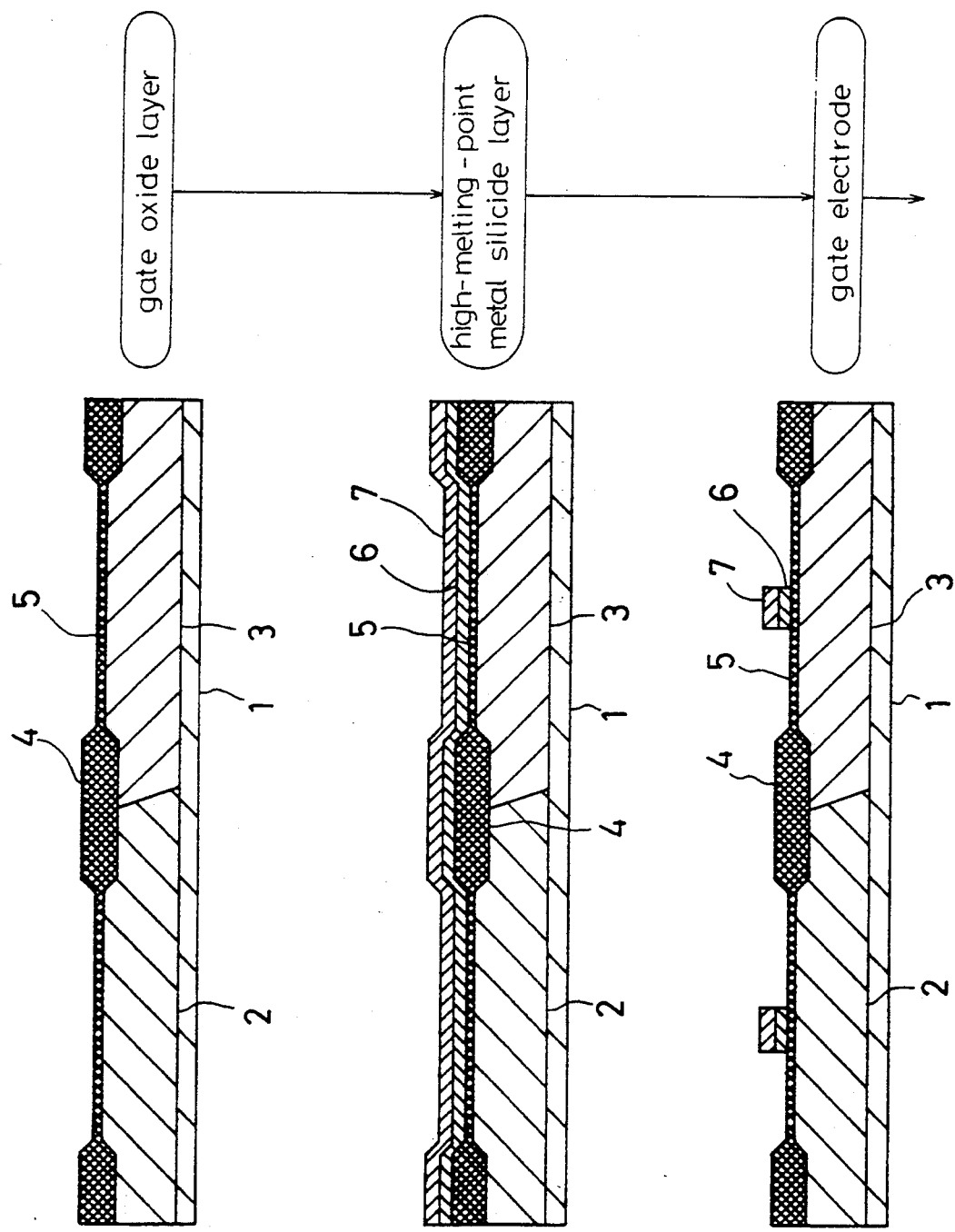

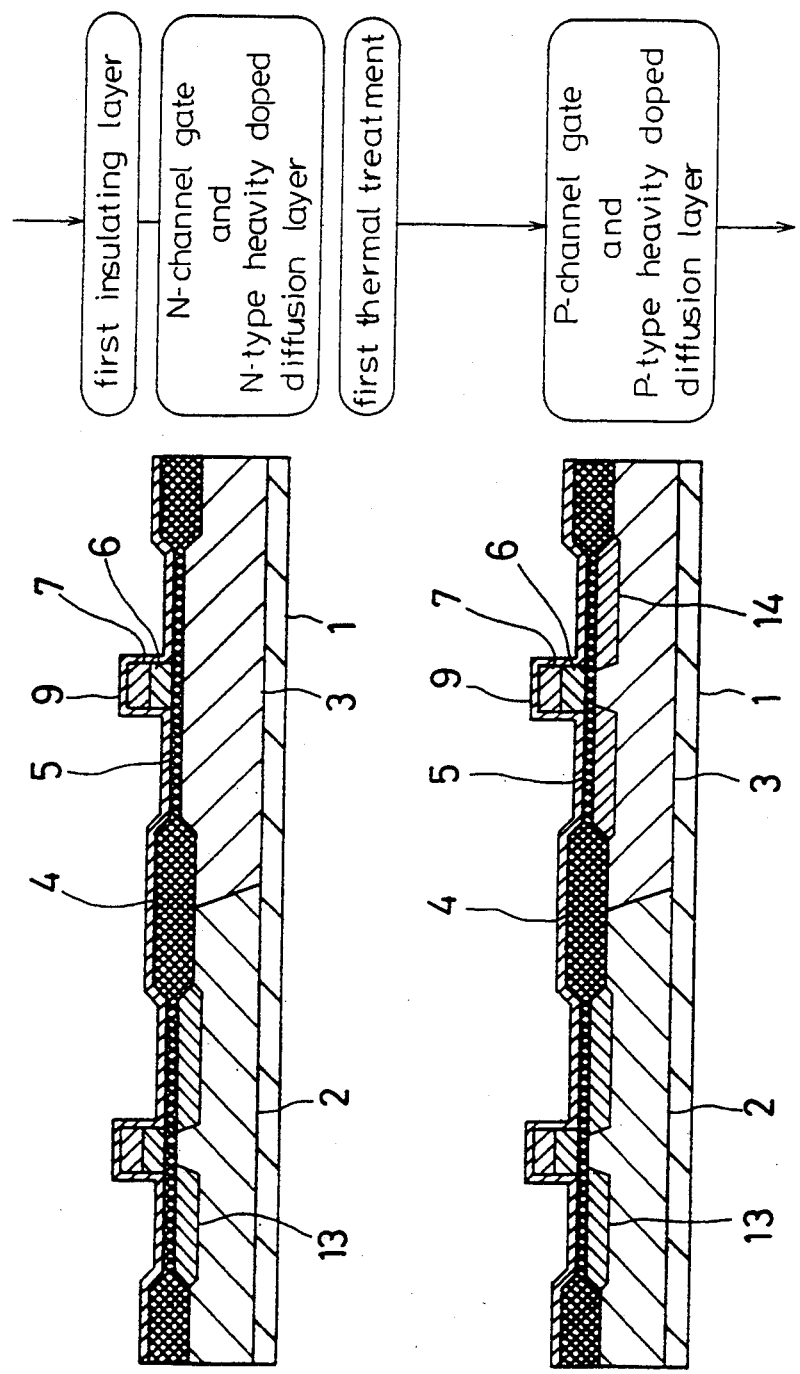

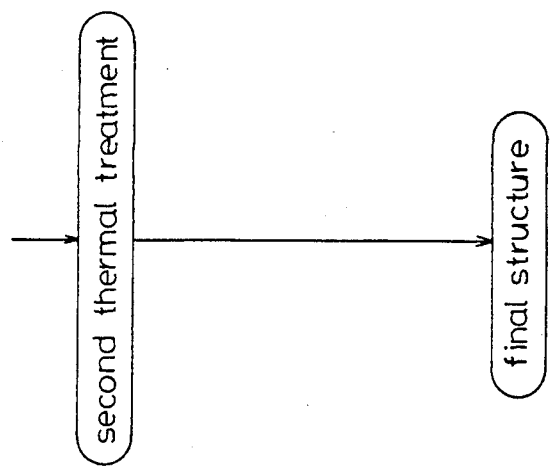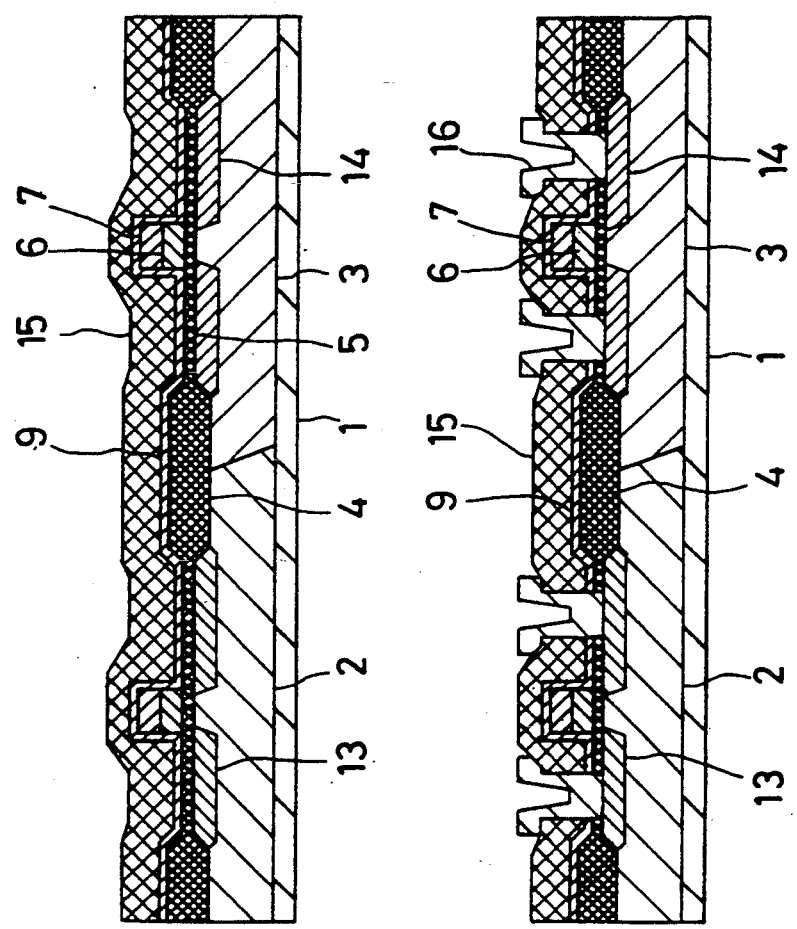
Fig.4(f)
Fig.4(g)

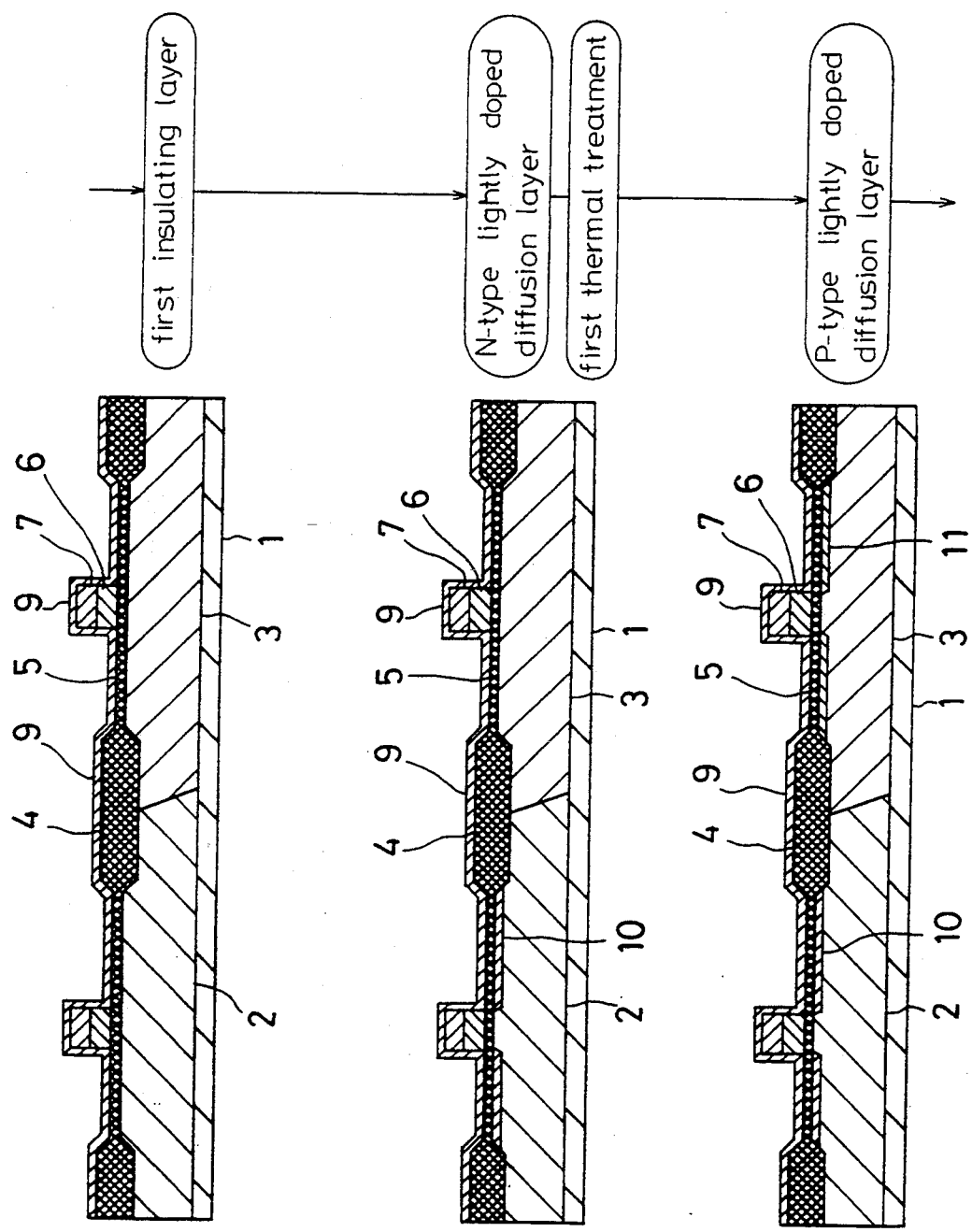

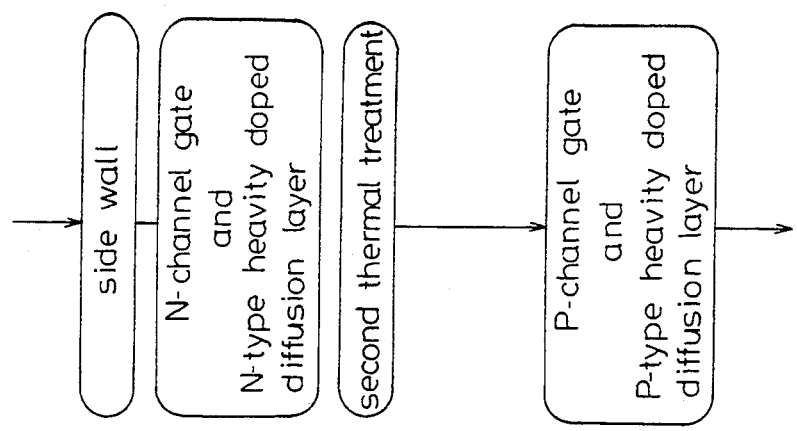
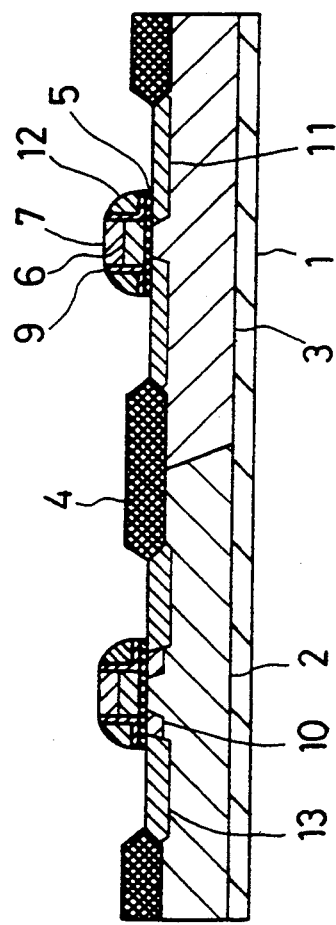
Fig.5(g)
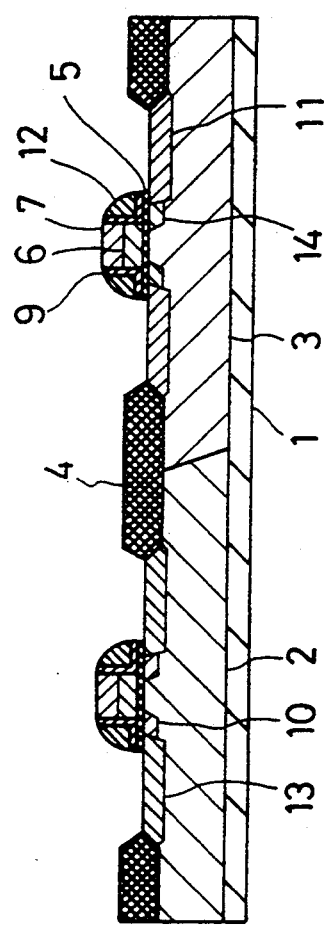
Fig.5(h)

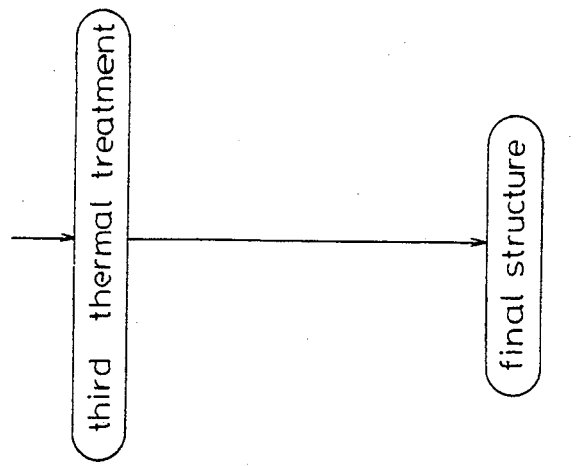
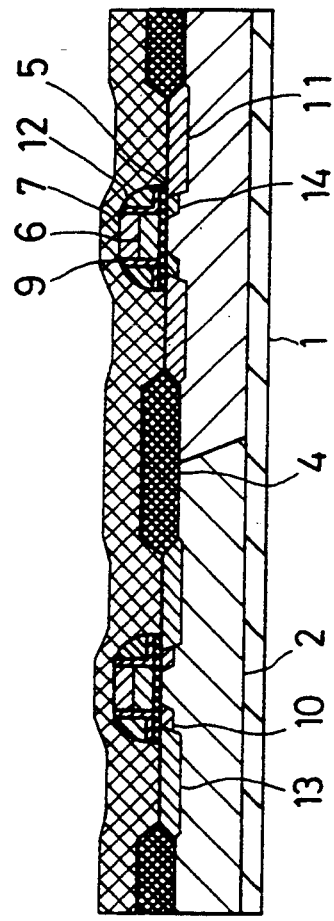
Fig.5(i)
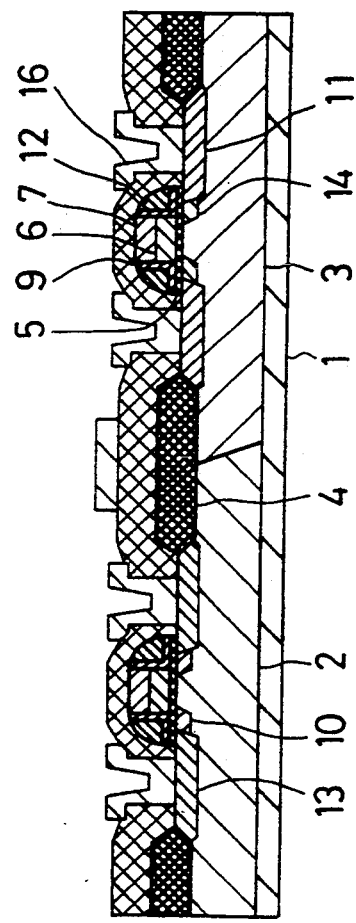
Fig.5(j)

Fig. 6

| STEP | FIRST EMBODIMENT | MODIFICATION OF FIRST EMBODIMENT | SECOND EMBODIMENT | MODIFICATION OF SECOND EMBODIMENT | THIRD EMBODIMENT | MODIFICATION OF THIRD EMBODIMENT |
|---|---|---|---|---|---|---|
| GATE ELECTRODE | | | | | | |
| | | FIRST THERMAL TREATMENT | | FIRST THERMAL TREATMENT | | FIRST THERMAL TREATMENT |
| N-TYPE LIGHTLY DIFFUSION LAYER | | | | | | |
| | | | FIRST THERMAL TREATMENT | SECOND THERMAL TREATMENT | FIRST THERMAL TREATMENT | SECOND THERMAL TREATMENT |
| P-TYPE LIGHTLY DIFFUSION LAYER | | | | | | |
| SIDE WALL | | SECOND THERMAL TREATMENT | | | | |
| N-TYPE HEAVILY DIFFUSION LAYER | FIRST THERMAL TREATMENT | | SECOND THERMAL TREATMENT | THIRD THERMAL TREATMENT | | |
| P-TYPE HEAVILY DIFFUSION LAYER | | THIRD THERMAL TREATMENT | | | | |
| | SECOND THERMAL TREATMENT | | THIRD THERMAL TREATMENT | THIRD THERMAL TREATMENT | SECOND THERMAL TREATMENT | THIRD THERMAL TREATMENT |

Fig.7

| step | embodiment | forth embodiment | fifth embodiment |
|---|---|---|---|
| gate electrode | | ◯ | ◯ |
| N-type lightly diffusion layer | | ◯ | ◯ |
| | | | first thermal treatment |
| P-type lightly diffusion layer | | | ◯ |
| side wall | | | ◯ |
| N-type heavily diffusion layer N-type gate | | ◯ | ◯ |
| | | first thermal treatment | second thermal treatment |
| P-type heavily diffusion layer P-type gate | | ◯ | ◯ |
| | | second thermal treatment | third thermal treatment |

Fig.8

| | gate electrode | N-type lightly diffusion layer | P-type lightly diffusion layer | N-type heavily diffusion layer | P-type lightly diffusion layer |
|---|---|---|---|---|---|
| first embodiment | first thermal treatment | | | first thermal treatment | second thermal treatment |
| modification of first embodiment | first thermal treatment | | | second thermal treatment | third thermal treatment |
| second embodiment | first thermal treatment | first thermal treatment | second thermal treatment | second thermal treatment | second thermal treatment |
| modification of second embodiment | first thermal treatment | second thermal treatment | third thermal treatment | third thermal treatment | third thermal treatment |
| third embodiment | first thermal treatment | first thermal treatment | | second thermal treatment | second thermal treatment |
| modification of third embodiment | first thermal treatment | second thermal treatment | | third thermal treatment | third thermal treatment |

Fig.9

| | gate electrode | N-type lightly diffusion layer | P-type lightly diffusion layer | N-type heavily diffusion layer N-type gate | P-type lightly diffusion layer P-type gate |
|---|---|---|---|---|---|
| forth embodiment | first thermal treatment | | | first thermal treatment | second thermal treatment |
| fifth embodiment | first thermal treatment | first thermal treatment | second thermal treatment | second thermal treatment | third thermal treatment |

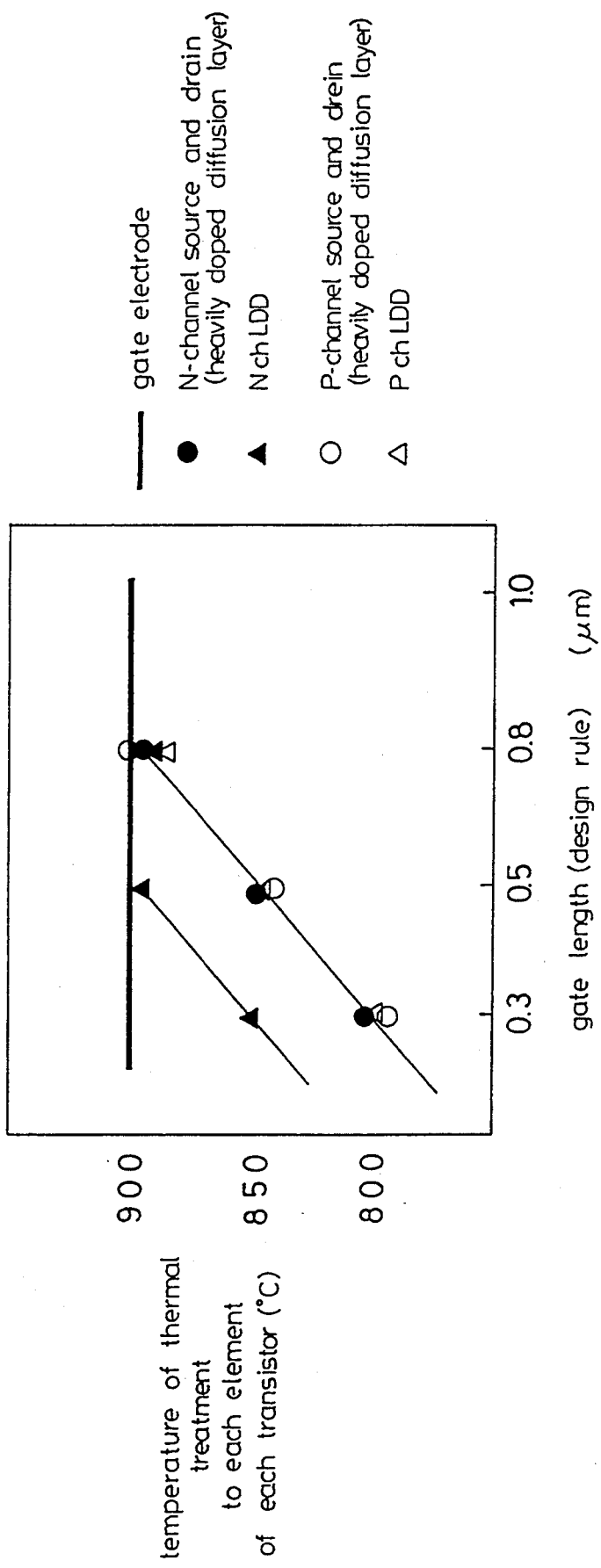

MANUFACTURING METHOD OF CMOS TRANSISTOR IN WHICH HEAT TREATMENT AT HIGHER TEMPERATURE IS DONE PRIOR TO HEAT TREATMENT AT LOW TEMPERATURE

BACKGROUND OF THE INVENTION

This invention relates to a method of manufacturing a highly-integrated CMOS transistor having high reliability.

Recently, further micro-fabrication of a CMOS transistor is required, associated with high integration of an LSI.

Accompanied by the micro-fabrication, problems are involved such as:

1) lowering of a characteristic of the transistor due to short channel effect which is caused by shortened channel length of the transistor;
2) Increase in parasitic resistance and contact resistance due to formation of shallow source and drain; and
3) increase in electrode resistance due to micro gate electrode.

In order to contemplate a further micro transistor, the above problems should be solved.

Meanwhile, in a manufacturing process, a thermal treatment to a gate electrode and diffusion layers to which N-type or P-type impurities are respectively doped is conducted for activating each element such as the gate electrodes and the N-type and P-type impurity diffusion layers and for planarizing an interposed insulating layer between layers at a latter stage after each element are formed.

In case where the thermal treatment is conducted for activating each element and for planarizing the interposed insulating layer is conducted at a latter stage in the manufacturing process, however, below-mentioned problems arise.

For example, with a typical CMOS transistor of polycide structure in which a high-melting-point metal silicide layer is deposited as a gate electrode on a polycrystalline silicon layer:

1) As shown in FIG. 11, since a thermal treatment to the gate electrode at low temperature depletes the gate electrode, the temperature of the thermal treatment is preferable to set comparatively high (e.g., 900° C.) for activating the gate impurity. As shown in FIG. 12, since the thermal treatment to the gate electrode at low temperature increases a resistance of the gate electrode, the temperature of the thermal treatment is preferable to set also comparatively high for lowering the resistance of the gate electrode. With the thermal treatment at low temperature, the gate electrode is depleted and the resistance of the gate electrode is increased, which causes lowering of the characteristic of the transistor.

2) As shown in FIG. 13, in order to prevent the transistor from short channel effect and declination of punch-through voltage, the thermal treatment to fully activate the impurity in impurity diffusion layers which form a source or a drain and not to decrease an effective channel length of the transistor is required.

3) In case where a P-type impurity such as boron is doped to the gate electrode of a P-channel transistor for forming a P-channel transistor of surface channel type (dual gate transistor), when the temperature of the thermal treatment is high, the P-type impurity tunnels through a gate oxide layer to diffuse in a substrate owing to a large diffusion coefficient of the P-type impurity. This causes change in threshold voltage.

As described above, the thermal treatment to each element of the transistor at optimum temperature is a key for satisfying requirements which are contrary to the general condition of the thermal treatment.

Meanwhile, with a conventional gate length (design rule), the thermal treatment at one time involves no problem. However, accompanied by the micro-fabrication of the CMOS transistor, a difference becomes large between suitable temperature of the thermal treatment for each element and that of the thermal treatment at one time.

In order to improve an electrical characteristic of micro CMOS transistor whose channel length is not more than sub-micron and a reliability of micro CMOS transistor, below mentioned difficulties must be overcome.

1) prevention of the gate electrode by deactivation of the gate impurity from depletion;
2) prevention of increase in short channel effect and of declination of punch-through voltage due to reduction of the effective channel length; and
3) prevention of impurity of the P-type gate electrode from tunneling through the gate oxide layer.

From now on, associated with micronization of design rule to half-micron or quarter-micron, and micro-fabrication of CMOS transistor, the above difficulties must be overcome.

SUMMARY OF THE INVENTION

The present invention has its object of providing a method of manufacturing a CMOS transistor in which the gate electrodes are not depleted, the short channel effect does not increase, the punch-through voltage is not declined and the impurity of the P-type gate electrode does not tunnel through the gate oxide layer.

To attain the above object, in the present invention, a thermal treatment to gate electrodes, a thermal treatments to N-type heavily doped diffusion layers and a thermal treatment to P-type heavily doped diffusion layers are separately conducted in accordance with respective design rule, wherein a thermal treatment at high temperature is conducted before to elements which require the thermal treatment at high temperature, then the thermal treatment at low temperature is conducted to elements which require a thermal treatment at low temperature after the thermal treatment at high temperature.

A first method of manufacturing a CMOS transistor in the present invention comprises the steps of: forming gate electrodes of an N-channel transistor and a P-channel transistor on a semiconductor substrate with a gate insulating layer therebetween; forming N-type heavily doped diffusion layers to be a source or a drain of the N-channel transistor; forming P-type heavily doped diffusion layers to be a source or a drain of the P-channel transistor; and conducting, independently to one another, at least two thermal treatments among a thermal treatment to said gate electrodes, a thermal treatment to said N-type heavily doped diffusion layers and a thermal treatment to said P-type heavily doped diffusion layers, wherein a later thermal treatment is conducted at a lower temperature than that of an earlier thermal treatment.

Thereby, the thermal treatment to gate electrodes, the thermal treatment to the N-type heavily doped diffusion layers and the thermal treatment to the P-type heavily doped diffusion layers are conducted at respectively optimum temperatures, which prevents depletion of gate electrodes accompanied by deactivation of the gate impurity, increase in short channel effect due to decrease in effective gate channel length, declination of punch-through voltage and tunneling of the P-type impurity through the gate oxide layer.

In addition, since the later thermal treatment is conducted at a lower temperature than that of the earlier thermal treatment, a thermal treatment at high temperature after the thermal treatment at low temperature to elements is avoided.

According to the first manufacturing method of a CMOS transistor, a micro CMOS transistor of not more than half micron or quarter micron which has superior electric characteristic and reliability is manufactured without failure.

A second method of manufacturing a CMOS transistor in the present invention comprises the steps of: forming gate electrodes of an N-channel transistor and a P-channel transistor on a semiconductor substrate with a gate insulating layer therebetween; conducting a first thermal treatment to said gate electrodes; forming N-type heavily doped diffusion layers to be a source or a drain of the N-channel transistor, using the gate electrode of the N-channel transistor as a mask; conducting a second thermal treatment to said N-type heavily doped diffusion layers at a lower temperature than that of the first thermal treatment; forming P-type heavily doped diffusion layers to be a source or a drain of the P-channel transistor, using the gate electrode of the P-channel transistor as a mask; and conducting a third thermal treatment to said P-type heavily doped diffusion layers at a lower temperature than that of the second thermal treatment.

Hence, gate electrodes which requires thermal treatment at comparatively high temperature for activation is thermal-treated at comparatively high temperature, thus preventing the depletion of the gate electrodes.

As to the N-type heavily doped diffusion layers, the thermal treatment at lower temperature than that to the gate electrodes is conducted, which prevents declination of punch-through voltage between the source and drain of the N-channel transistor. Also, as to the N-type heavily doped diffusion layers, since the thermal treatment at higher temperature than that to the P-type heavily doped diffusion layers is conducted, the impurity in the N-type heavily doped diffusion layers is activated even with the P-type impurity of large diffusion coefficient.

Since the thermal treatment at lower temperature than that to the N-type heavily doped diffusion layers is conducted to the P-type heavily doped diffusion layers, the declination of punch-through voltage between the source and the drain of the P-channel transistor is prevented even with the P-type impurity of large diffusion coefficient.

According to the second manufacturing method of a CMOS transistor, the extremely micro CMOS transistor of single drain structure is improved in the electric characteristic and the reliability.

A third method of manufacturing a CMOS transistor in the present invention comprises the steps of: forming gate electrodes of an N-channel transistor and a P-channel transistor on a semiconductor substrate with a gate insulating layer therebetween; forming N-type heavily doped diffusion layers to be a source or a drain of the N-channel transistor, using the gate electrode of the N-channel transistor as a mask; conducting a first thermal treatment to said gate electrodes and said N-type heavily doped diffusion layers; forming P-type heavily doped diffusion layers to be a source or a drain of the P-channel transistor, using the gate electrode of the P-channel transistor as a mask; and conducting a second thermal treatment to said P-type heavily doped diffusion layers at a lower temperature than that of the first thermal treatment.

Thereby, the thermal treatment at comparatively high temperature is conducted to gate electrodes and the N-type heavily doped diffusion layers which require thermal treatment at comparatively high temperature for activation, thus the gate electrodes are prevented from depletion and the N-type heavily doped diffusion layers are activated.

As to the P-type heavily doped diffusion layers, the thermal treatment at comparatively low temperature is conducted, so that the declination of the punch-through between the source and the drain of the P-channel transistor is prevented though the P-type impurity has a large diffusion coefficient.

According to the third manufacturing method of a CMOS transistor, the electric characteristic and the reliability of the micro CMOS transistor of single drain structure are improved.

A fourth method of manufacturing a CMOS transistor in the present invention comprises the steps of: forming gate electrodes of an N-channel transistor and a P-channel transistor on a semiconductor substrate with a gate insulating layer therebetween; conducting a first thermal treatment to said gate electrodes; forming N-type lightly doped diffusion layers to be a source or a drain of the N-channel transistor, using the gate electrode of the N-channel transistor as a mask; conducting a second thermal treatment to said N-type lightly doped diffusion layers at a lower temperature than that of the first thermal treatment; forming P-type lightly doped diffusion layers to be a source or a drain of the P-channel transistor, using the gate electrode of the P-channel transistor as a mask; forming side walls on side surfaces of said gate electrodes; forming N-type heavily doped diffusion layers to be a source or a drain of the N-channel transistor, using the gate electrode and the side walls of the N-channel transistor as a mask; forming P-type heavily doped diffusion layers to be a source or a drain of the P-channel transistor, using said gate electrode and the side walls of the P-channel transistor as a mask; and conducting a third thermal treatment to said P-type lightly doped diffusion layers, said N-type heavily doped diffusion layers and said P-type heavily doped diffusion layers at a lower temperature than that of the second thermal treatment.

Thereby, the thermal treatment at comparatively high temperature is conducted to gate electrodes which requires thermal treatment at comparatively high temperature for activation, thus the gate electrodes are prevented from depletion.

As to the N-type lightly doped diffusion layers, the thermal treatment at higher temperature than that to the P-type lightly doped diffusion layers, N-type heavily doped diffusion layers and the P-type heavily doped diffusion layers, so that the impurity of the N-type lightly doped diffusion layers is activated, decreasing the channel resistance of the N-channel transistor.

The thermal treatment at lower temperature than that to the N-type lightly doped diffusion layers is conducted to the P-type lightly doped diffusion layers, the N-type heavily doped diffusion layers and the P-type heavily doped diffusion layers, so that the declination of the punch-through voltages between the sources and the drains of the N-channel transistor and the P-channel transistor is prevented, while activating the impurity diffusion layers.

According to the fourth method of manufacturing a CMOS transistor, the electric characteristic and the reliability are improved in the extremely micro CMOS transistor having the N-channel transistor and P-channel transistor of LDD structure.

A fifth method of manufacturing a CMOS transistor in the present invention comprises the steps of: forming gate electrodes of an N-channel transistor and a P-channel transistor on a semiconductor substrate with a gate insulating layer therebetween; forming N-type lightly doped diffusion layers to be a source or a drain of the N-channel transistor, using the gate electrode of the N-channel transistor as a mask; conducting a first thermal treatment to said gate electrodes and said N-type lightly doped diffusion layers of the N-channel transistor; forming P-type lightly doped diffusion layers to be a source or a drain of the P-channel transistor, using the gate electrode of the P-channel transistor as a mask; forming side walls on side surfaces of said gate electrodes of the N-channel transistor and the P-channel transistor; forming N-type heavily doped diffusion layers to be a source or a drain of the N-channel transistor, using said gate electrode and said side walls of the N-channel transistor as a mask; forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

Thereby, the thermal treatment at comparatively high temperature is conducted to gate electrodes and the N-type lightly doped diffusion layers which require thermal treatment at comparatively high temperature for activation, thus the gate electrodes are prevented from depletion and the impurity of the N-type lightly doped diffusion layers are activated, reducing the channel resistance of the N-channel transistor.

The thermal treatment at lower temperature than that to the N-type lightly doped diffusion layers is conducted to the P-type lightly doped diffusion layers, the N-type heavily doped diffusion layers and the P-type heavily doped diffusion layers. As a result, the declination of the punch-through voltage between the sources and the drains of the N-channel transistor and the P-channel transistor is prevented, while activating the impurity in the diffusion layers.

According to the fifth method of manufacturing a CMOS transistor, the electric characteristic and the reliability is improved in the micro CMOS transistor having the N-channel transistor and the P-channel transistor of LDD structure.

A sixth method of manufacturing a CMOS transistor in the present invention comprises the steps of: forming gate electrodes of an N-channel transistor and a P-channel transistor on a semiconductor substrate with a gate insulating layer therebetween; conducting a first thermal treatment to said gate electrodes; forming N-type lightly doped diffusion layers to be a source or a drain of the N-channel transistor, using said gate electrode of the N-channel transistor as a mask; conducting a second thermal treatment to the N-type lightly doped diffusion layers at a lower temperature than that of the first thermal treatment; forming P-type heavily doped diffusion layers to be a source or a drain of the P-channel transistor, using said gate electrode of the P-channel transistor as a mask; forming side walls on side surfaces of said gate electrode of the N-channel transistor; forming N-type heavily doped diffusion layers to be a source or a drain of the N-channel transistor, using said gate electrode and said side walls of the N-channel transistor; and conducting a third thermal treatment to the N-type heavily doped diffusion layers and the P-type heavily doped diffusion layers at a lower temperature than that of the second thermal treatment.

Thereby, the thermal treatment at comparatively high temperature is conducted to gate electrodes which requires thermal treatment at comparatively high temperature for activation, thus the gate electrodes are prevented from depletion.

As to the N-type lightly doped diffusion layers, the second thermal treatment at higher temperature than that of the third thermal treatment is conducted to activate the impurity of the N-type lightly doped diffusion layers, thus the channel resistance of the N-channel transistor is reduced.

As to the N-type heavily doped diffusion layers and the P-type heavily doped diffusion layers, the thermal treatment at lower temperature than that to the N-type lightly doped diffusion layers. As a result, the punch-through voltage between the source and the drain of the P-channel transistor is prevented from declination, while activating the impurity of the diffusion layers.

According to the sixth method of manufacturing a CMOS transistor, the electric characteristic and the reliability are improved in the extremely micro CMOS transistor having the N-channel transistor of LDD structure and the P-channel transistor of single drain structure.

A seventh method of manufacturing a CMOS transistor in the present invention comprises the steps of: forming gate electrodes of an N-channel transistor and a P-channel transistor on a semiconductor substrate with a gate insulating layer therebetween; forming N-type lightly doped diffusion layers to be a source or a drain of the N-channel transistor, using said gate electrode of the N-channel transistor as a mask; conducting a first thermal treatment to said gate electrodes and said N-type lightly doped diffusion layers; forming P-type heavily doped diffusion layers to be a source or a drain of the P-channel transistor, using said gate electrode of the P-channel transistor as a mask; forming side walls on side surfaces of said gate electrode of the N-channel transistor; forming N-type heavily doped diffusion layers to be a source or a drain of the N-channel transistor, using said gate electrode and said side walls of the N-channel transistor as a mask; and conducting a second thermal treatment to said P-type heavily doped diffusion layers and said N-type heavily doped diffusion layers at a lower temperature than that of the first thermal treatment.

Thereby, the thermal treatment at comparatively high temperature is conducted to gate electrodes and the N-type lightly doped diffusion layers which require thermal treatment at comparatively high temperature for activation, thus the gate electrodes are prevented from depletion and the impurity of the N-type heavily doped diffusion layers is activated, reducing the channel resistance of the N-channel transistor.

The thermal treatment at lower temperature than that to the N-type lightly doped diffusion layers is conducted to the N-type heavily doped diffusion layers and the P-type heavily doped diffusion layers, so that the declination of the punch-through voltage between the sources and the drains of the N-channel transistor and the P-channel transistor is prevented, while activating the impurity of the diffusion layers.

According to the seventh method of manufacturing a CMOS transistor, the electric characteristic and the reliability are improved in the micro CMOS transistor having the N-channel transistor of LDD structure and the P-channel transistor of single drain structure.

In first to seventh manufacturing methods of a CMOS transistor, gate electrodes may have a laminated structure composed of a polycrystalline silicon to which N-type or P-type impurity is doped and a high-melting-point metal silicide laminated on the polycrystalline silicon. Thereby, the micro CMOS transistor having polycide gate electrodes can be manufactured.

An eighth method of manufacturing a CMOS transistor in the present invention comprises the steps of: depositing, after a polycrystalline silicon layer is deposited on a semiconductor substrate with a gate insulating layer therebetween, a high-melting-point metal silicide layer on said polycrystalline silicon layer; forming, after a first insulating layer is deposited on said high-melting-point metal silicide layer, gate electrodes of an N-channel transistor and a P-channel transistor by ray-etching said high-melting-point metal silicide layer and said first insulating layer; depositing a second insulating layer on an upper surface and both side surfaces of said gate electrodes; forming N-type lightly doped diffusion layers to be a source or a drain of the N-channel transistor, using said gate electrode of the N-channel transistor as a mask; conducting a first thermal treatment to said gate electrode and the N-type lightly doped diffusion layers; forming P-type lightly doped diffusion layers to be a source or a drain of the P-channel transistor, using said gate electrode of the P-channel transistor as a mask; forming side walls on side surfaces of said electrodes; forming N-type heavily doped diffusion layers to be a source or a drain of the N-channel transistor, using said gate electrode and said side walls of the N-channel transistor as a mask; forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

Thereby, since the first thermal treatment at comparatively high temperature is conducted to gate electrodes and the N-type lightly doped diffusion layers which require thermal treatment at comparatively high temperature for activation, the gate electrodes are prevented from depletion and the N-type lightly doped diffusion layers are activated, which reduces the channel resistance of the N-channel transistor. In this case, the first thermal treatment is conducted after the second insulating film is formed on the upper surface and both side surfaces of gate electrodes, namely after the high-melting-point metal silicide composing the polycide gate electrodes is covered with the second insulating layer. Thus, the abnormal oxidation of the high-melting-point metal silicide is prevented.

As to the N-type heavily doped diffusion layers and the P-type heavily doped diffusion layers, the thermal treatment is conducted at lower temperature than that to the N-type lightly doped diffusion layers, so that the impurity of the diffusion layers is activated, while preventing the declination of punch-through voltage between the sources and the drains of the N-channel transistor and the P-channel transistor.

According to the eighth method of manufacturing a CMOS transistor, the electric characteristic and the reliability are improved in the micro CMOS transistor having the polycide gate and the N-channel transistor and P-channel transistor of LDD structure.

A ninth method of manufacturing a CMOS transistor in the present invention comprises the steps of: depositing, after a polycrystalline silicon layer is deposited on a semiconductor substrate with a gate insulating layer therebetween, a high-melting-point metal silicide layer on said polycrystalline silicon layer; forming, after a first insulating layer is deposited on said high-melting-point metal silicide layer, gate electrodes of an N-channel transistor and a P-channel transistor by dray-etching said high-melting-point metal silicide layer and said first insulating layer; depositing a second insulating layer on an upper surface and both side surfaces of said gate electrodes; forming N-type lightly doped diffusion layers to be a source or a drain of the N-channel transistor, using said gate electrode of the N-channel transistor as a mask; conducting a first thermal treatment to said gate electrodes and said N-type lightly doped diffusion layers: forming side walls on side surfaces of said gate electrodes; forming N-type heavily doped diffusion layers to be a source or a drain of the N-channel transistor, using said gate electrode and said side walls of the N-channel transistor as a mask; forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

Thereby, the first thermal treatment at comparatively high temperature is conducted to gate electrodes and the N-type lightly doped diffusion layers which require thermal treatment at comparatively high temperature for activation, thus the depletion of the gate electrodes and the abnormal oxidation of the high-melting-point metal silicide are prevented, while reducing the channel resistance of the N-channel transistor, as well as in the above method.

Further, as to the N-type heavily doped diffusion layers and the P-type heavily doped diffusion layers, the thermal treatment at lower temperature than that to the N-type lightly doped diffusion layers, so that the declination of punch-through voltage between the sources and the drains of the N-channel transistor and the P-channel transistor is prevented, while activating the impurity of the diffusion layers.

According to the ninth method of manufacturing a CMOS transistor, the electric characteristic and the reliability are improved in the micro CMOS transistor having the polycide gate electrodes, the N-channel transistor of LDD structure and P-channel transistor of single drain structure.

A tenth method of manufacturing a CMOS transistor, comprising the steps of: forming gate electrodes of an N-channel transistor and a P-channel transistor on a semiconductor substrate with an gate insulating layer therebetween; forming an N-type gate electrode by heavily doping an N-type impurity to said gate electrode of the N-channel transistor and forming N-type heavily doped diffusion layers by heavily doping an N-type impurity to regions to be a source or a drain of the N-channel transistor, using said gate electrode of the N-channel transistor as a mask; conducting a first thermal treatment to said N-type gate electrode and said N-type heavily doped diffusion layers; forming a P-type gate electrode by heavily doping a P-type impurity to said gate electrode of the P-channel transistor and forming P-type heavily doped diffusion layers by heavily doping a P-type impurity to regions to be a source or a drain of the P-channel transistor, using said gate electrode of the P-channel transistor as a mask; and conducting a second thermal treatment to said P-type gate electrode and said P-type heavily doped diffusion layers at a lower temperature than that of the first thermal treatment.

Thereby, the thermal treatment at comparatively high temperature is conducted to the N-type gate electrode and the N-type heavily doped diffusion layers to which N-type impurity of comparatively small diffusion coefficient is doped, so that the N-type impurity is fully activated.

As to the P-type gate electrode to which the P-type impurity of comparatively large diffusion coefficient is doped, the thermal treatment at comparatively low temperature is conducted. Consequently, the P-type impurity is prevented from tunneling through the gate oxide layer to diffuse in the N-type diffusion layers, with a result of preventing the change in threshold voltage. Further, since the thermal treatment at comparatively low temperature is conducted to the P-type heavily doped diffusion layers to which the P-type impurity of comparatively large diffusion coefficient is doped, the declination of the punch-through voltage between the source and the drain of the P-channel transistor is prevented.

According to the tenth method of manufacturing a CMOS transistor, the electric characteristic and the reliability are improved in the CMOS transistor of single drain structure having dual gate electrode.

An eleventh method of manufacturing a CMOS transistor in the present invention comprises the steps of: forming gate electrodes of an N-channel transistor and a P-channel transistor on a semiconductor substrate with a gate insulating layer therebetween; forming N-type lightly doped diffusion layers to be a source or a drain of the N-channel transistor, using said gate electrode of the N-channel transistor as a mask; conducting a first thermal treatment to said N-type lightly doped diffusion layers; forming P-type lightly doped diffusion layers to be a source or a drain of the P-channel transistor, using said gate electrode of the P-channel transistor as a mask; forming side walls on side surfaces of said gate electrodes; forming an N-type gate electrode by heavily doping an N-type impurity to said gate electrode of the N-channel transistor and forming N-type heavily doped diffusion layers by heavily doping an N-type impurity to regions to be a source or a drain of the N-channel transistor, using said gate electrode and said side walls of the N-channel transistor as a mask; conducting a second thermal treatment to said P-type lightly doped diffusion layers, said N-type gate electrode and said N-type heavily doped diffusion layers at a lower temperature than that of the first thermal treatment; forming a P-type gate electrode by heavily doping a P-type impurity to said gate electrode of the P-channel transistor and forming P-type heavily doped diffusion layers by heavily doping a P-type impurity to regions to be a source or a drain of the P-channel transistor, using said gate electrode and said side walls of the P-channel transistor as a mask; and conducting a third thermal treatment to said P-type gate electrode and said P-type heavily doped diffusion layers at a lower temperature than that of the second thermal treatment.

Thereby, the first thermal treatment at comparatively high temperature is conducted to the N-type lightly doped diffusion layers, so that the impurity of the N-type lightly doped diffusion layers is fully activated, reducing the channel resistance of the N-channel transistor.

The thermal treatment at slightly high temperature is conducted to the P-type lightly doped diffusion layers of low impurity density to which the P-type impurity of comparatively large diffusion coefficient is doped and the N-type gate electrode and the N-type heavily doped diffusion layers to which the N-type impurity of comparatively small diffusion coefficient is doped. Consequently, the impurity of the P-type lightly doped diffusion layers, N-type gate electrode and the N-type heavily doped diffusion layers is activated.

Since the thermal treatment at comparatively low temperature is conducted to the P-type gate electrode and the P-type heavily doped diffusion layers to which the P-type impurity of comparatively large diffusion coefficient is heavily doped, the P-type impurity is prevented from tunneling through the gate oxide layer to diffuse in the N-type diffusion layers, which prevents change in threshold voltage. In addition, the declination of punch-through voltage between the source and the drain of the P-channel transistor is prevented.

According to the eleventh method of manufacturing a CMOS transistor, the electric characteristic and the reliability are improved in the CMOS transistor of LDD structure having the dual gate electrode.

BRIEF DESCRIPTION OF THE DRAWINGS

FIGS. 1(a)–(g) are sections showing respective steps of manufacturing a CMOS transistor according to a first embodiment of the present invention.

FIGS. 2(a)–(j) are sections showing respective steps of manufacturing a CMOS transistor according to a second embodiment of the present invention.

FIGS. 3(a)–(i) are sections showing respective steps of manufacturing a CMOS transistor according to a third embodiment of the present invention.

FIGS. 4(a)–(g) are sections showing respective steps of manufacturing a CMOS transistor according to a fourth embodiment of the present invention.

FIGS. 5(a)–(j) are sections showing respective steps of manufacturing a CMOS transistor according to a fifth embodiment of the present invention.

FIG. 6 is a view showing schematic steps of manufacturing a CMOS transistor having a single gate electrode according to first to third embodiments and each modified example of first to third embodiment in the present invention.

FIG. 7 is a view showing thermal treatments conducted to each element in the method of manufacturing the CMOS transistor shown in FIG. 6.

FIG. 8 is a view showing schematic steps of manufacturing a CMOS transistor having a dual gate electrode according to fourth to fifth embodiments and each modified example of fourth to fifth embodiments.

FIG. 9 is a view showing the thermal treatment conducted to each element in the manufacturing method of a CMOS transistor shown in FIG. 8.

FIG. 13 is a graph showing a relation between threshold voltage and the gate length in case where the temperature of the thermal treatment which is applied to the gate electrodes of the CMOS transistor is varied.

DETAILED DESCRIPTION OF PREFERRED EMBODIMENTS

Each embodiment of a CMOS transistor manufacturing method according to the present invention is described below.

In the present invention, a step of thermal treatment to each element of the CMOS transistor is divided to plural steps for conducting thermal treatments at optimum temperature to respective elements.

FIG. 6 shows each step of a method of manufacturing a CMOS transistor having a single gate (corresponding to first to third embodiments), and FIG. 7 shows each step of a method of manufacturing a CMOS transistor having a dual gate (corresponding to fourth and fifth embodiments). FIG. 8 shows steps of conducting a thermal treatment to each element of the CMOS transistor having the single gate. FIG. 9 shows steps of conducting a thermal treatment to each element of the CMOS transistor having the dual gate.

Figures 5A, 5B, 5C:
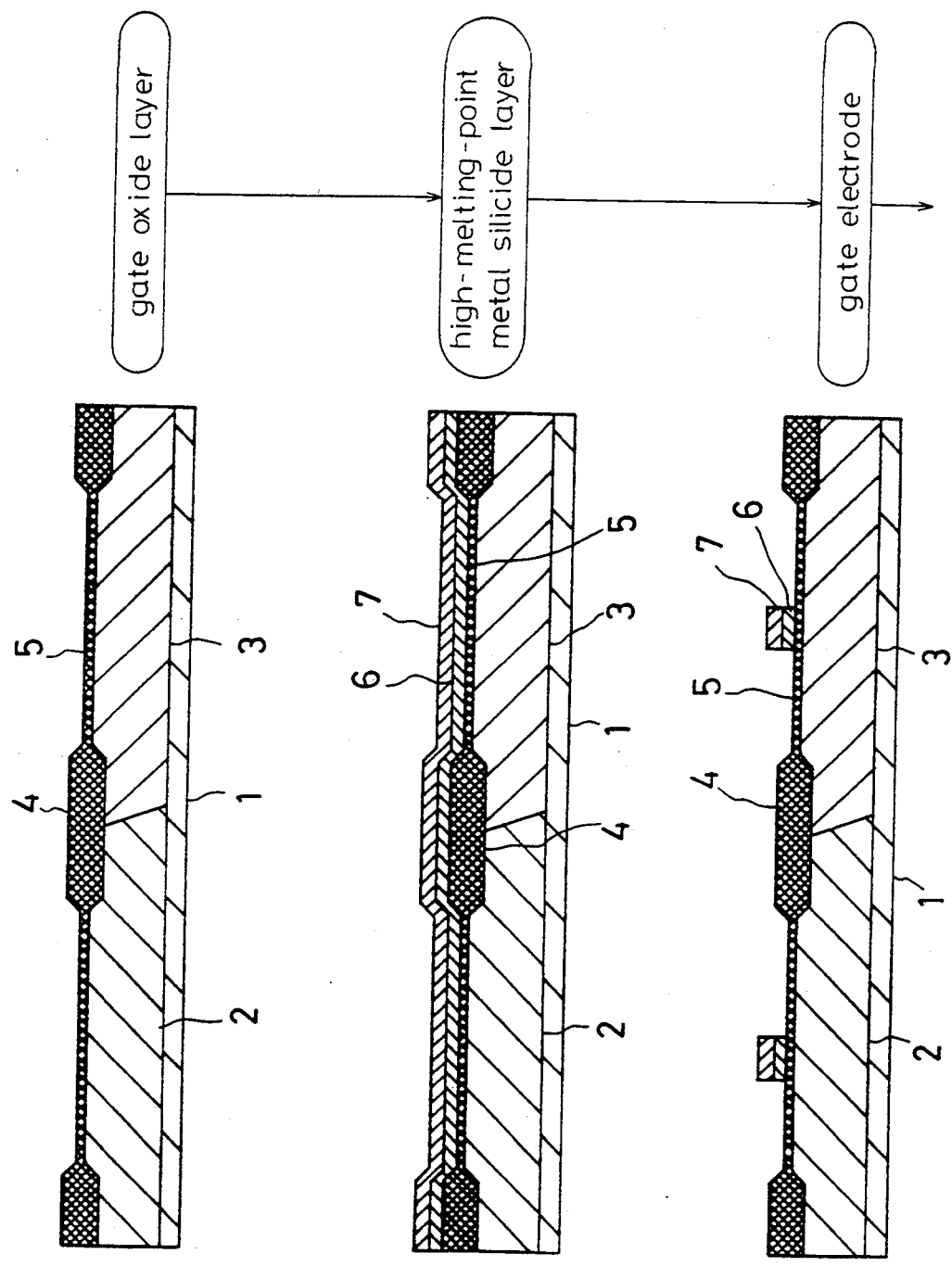
Figure 10:
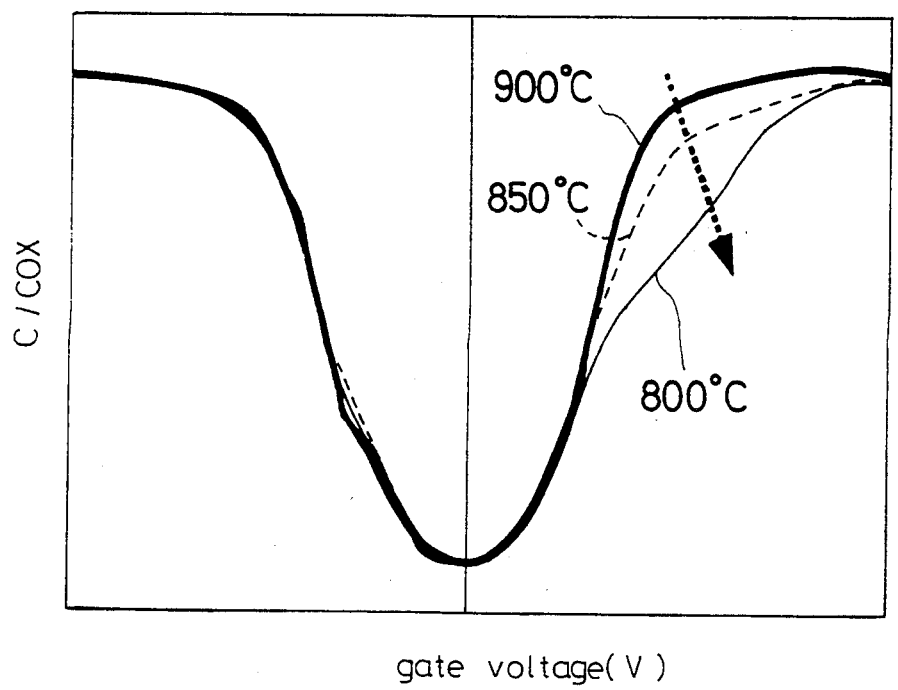
FIG. 10 is a graph showing a relation between a gate length of the CMOS transistor and each temperature of the thermal treatment for respectively, optimally forming the gate electrodes of the CMOS transistor, lightly doped diffusion layers and heavily doped diffusion layers of the N-channel transistor, and lightly doped diffusion layers and heavily doped diffusion layers of the P-channel transistor.
Figure 11:
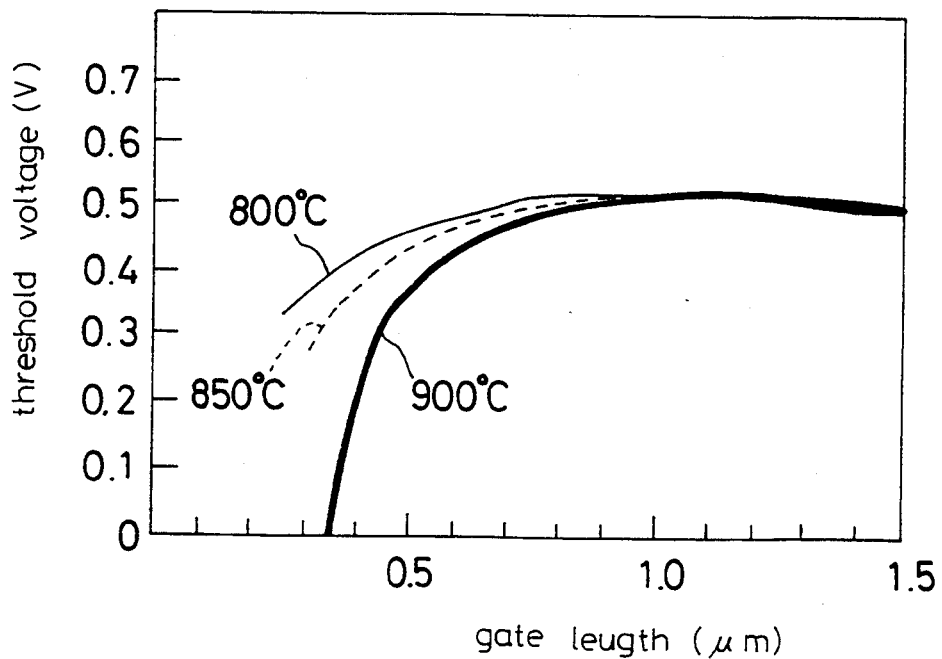
FIG. 11 is a graph showing a relation between the temperature of thermal treatment to the gate electrodes of the CMOS transistor and depletion of the gate electrodes.
Figure 12:
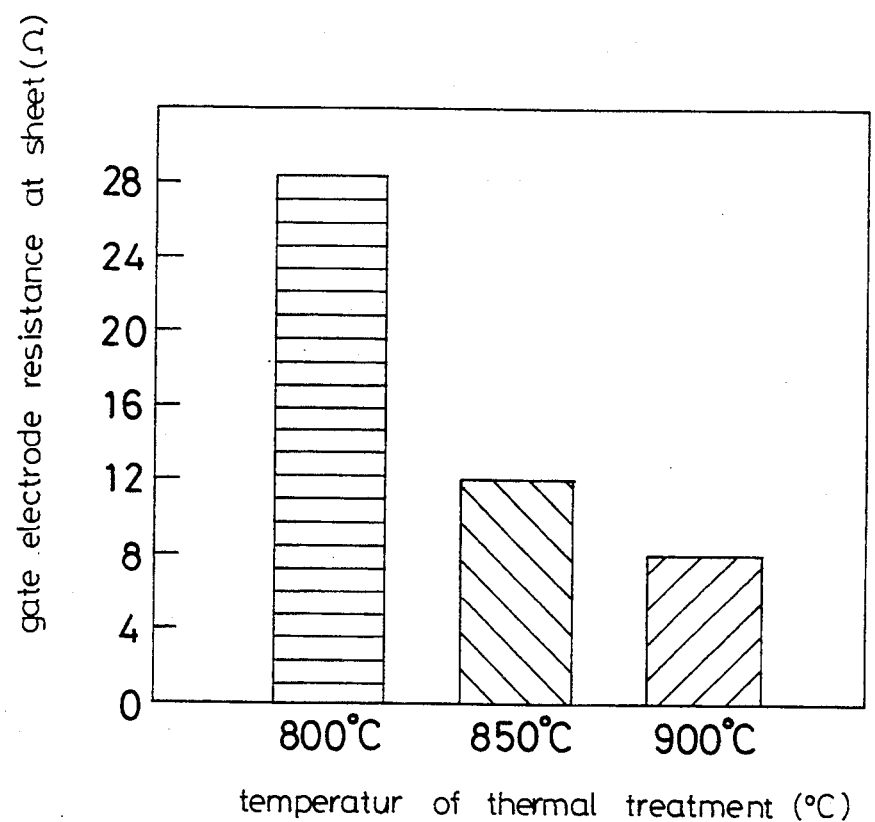
FIG. 12 is a graph showing a relation between the temperature of the thermal treatment to the gate electrodes of the CMOS transistor and the resistance of the gate electrodes.

FIG. 10 shows a condition of thermal treatment for making each element of the CMOS transistor optimized, and shows a relation between a gate length which expresses micro-fabrication degree of the CMOS transistor and the optimum temperature of the thermal treatment to each element. In the figure, for example, in case of a CMOS transistor of LDD structure with 0.5 μm gate length, 900° C. thermal treatment is optimum for gate electrodes and lightly doped diffusion layers of an N-channel transistor, and 850° C. thermal treatment is optimum for a source and a drain (heavily doped diffusion layers) of the N-channel transistor, lightly doped diffusion layers of a P-channel transistor, and a source and a drain (heavily doped diffusion layers) of the P-channel transistor.

In case with a CMOS transistor having a dual gate, an N-type impurity is doped to the gate electrode of the N-channel transistor and a P-type impurity is doped to the gate electrode of the P-channel transistor. As to a thermal treatment for activating the impurity doped to respective gate electrodes, suitable temperature of thermal treatment is different from each other in the N-channel transistor and the P-channel transistor.

(First Embodiment)

A method of manufacturing a CMOS transistor according to the first embodiment is discussed below, with reference to drawings.

FIGS. 1(a)–(g) are sections of an essential part showing respective steps of the manufacturing method of CMOS transistor of single drain structure having a single gate composed of polycide gate electrodes.

First, as shown in FIG.(a), after forming P-type diffusion layers 2 and an N-type diffusion layers 3 respectively on a P-type silicon substrate, a LOCOS oxide layer 4 of about 700 nm thickness and a gate oxide layer 5 of about 20 nm thickness are formed at respective set regions.

Next, as shown in FIG. 1(b), a polycrystalline silicon layer 6 is deposited to 250 nm thickness according to a low pressure CVD method. After a high-melting-point metal silicide layer 7 such as tungsten silicide is deposited to 200 nm thickness on the polycrystalline silicon layer 6 according to, for example, the low pressure CVD method, an N-type impurity such as arsenic (As) is doped into the high-melting-point metal silicide layer 7 with 40 KeV acceleration energy and $4 \times 10^{15} cm^{-2}$ dose according to an ion implanting method. The N-type impurity is diffused and activated in the polycrystalline silicon layer 6 by thermal treatments conducted at every step. Thereafter, a first insulating layer 8 is deposited to 150 nm thickness on the high-melting-point metal silicide layer 7.

Then, after a set resist pattern is formed (not shown), a gate patterning is conducted according to a dry etching technique, as shown in FIG. 1(c). At this time, the high-melting-point metal silicide layer 7 is exposed from a side of the gate electrode and is oxidized abnormally by a thermal treatment with this state, which means the thermal treatment cannot be conducted at this time.

As shown in FIG. 1(d), a second insulating layer 9 is deposited to 20 nm thickness. Thereafter, N-type heavily doped diffusion layers 13 are formed on the P-type diffusion layers 2 in such a manner that arsenic ions of the N-type impurity are implanted, according to the ion implanting method, to the N-type channel transistor region with 40 Kev acceleration energy and $5 \times 10^{15} cm^{-2}$ dose, using the gate electrode, the first insulating layer 9 (perpendicular part) and the resist pattern (not shown) as a mask. Subsequently, a first thermal treatment for activating the gate electrode and the N-type heavily doped diffusion layers 13 is conducted for 20 minutes at 900° C.

Then, as shown in FIG. 1(e), P-type heavily doped diffusion layers 14 are formed in such a manner that boron ions of the P-type impurity are implanted, according to the ion implanting method, to the P-type channel transistor region with 20 Kev acceleration energy and $5 \times 10^{15} cm^{-2}$ dose, using the gate electrode, the second insulating layer 9 (perpendicular part) and the resist pattern (not shown) as a mask.

Subsequently, as shown in FIG. 1(f), after an interposed insulating layer 15 between layers is formed on the second insulating layer 9, a second thermal treatment for activation and for planarizing the interposed insulating layer 15 is conducted for 30 minutes at 850° C.

Finally, as shown in FIG. 1(g), a contact hole and a metal wiring pattern 16 are formed, thus obtaining the CMOS transistor of single drain structure having the polycide gate electrodes.

In order to activate the gate impurity to the degree of preventing the depletion of gate electrodes, the thermal treatment must be conducted at comparatively high temperature about 900° C. However, when the thermal treatment at comparatively high temperature is conducted after forming the interposed insulating layer 15, e.g. the P-type heavily doped diffusion layers 14, a shallow connection cannot be formed owing to a large diffusion coefficient of boron in the P-type heavily doped diffusion layers 14, which declines punch-through voltage between a source and a drain. This makes impossible to contemplate a micro CMOS transistor.

Therefore, in the first embodiment, after the second insulating layer 9 is formed so as not to expose the high-melting-point metal silicide layer 7, the N-type heavily doped diffusion layers 13 to be the source or the drain of the N-channel transistor and the gate electrodes are activated by the first thermal treatment. In this way, since the thermal treatment at comparatively high temperature is conducted after the formation of the second insulating layer 9, the gate impurity is activated, while preventing the abnormal oxidation of the high-melting-point metal silicide layer 7.

The second thermal treatment activates the impurity of the P-type heavily doped diffusion layers, thus contemplating the micro CMOS transistor.

As shown in FIG. 6 as a modified example of the first embodiment, it is possible that the first thermal treatment at comparatively high temperature is conducted before the formation of the N-type heavily doped diffusion layers 13 and after the formation of the gate electrodes and a second thermal treatment at slightly lower temperature than that of the first thermal treatment is conducted after the formation of the N-type heavily doped diffusion layers 13. In this case, the second thermal treatment in the first embodiment shall be a third thermal treatment.

With a further micro gate length, the punch-through voltage between the source and the drain is declined in the N-type heavily doped diffusion layers 13 to be the source or the drain of the N-channel transistor to which arsenic of comparatively small diffusion coefficient is doped. Accordingly, the thermal treatment is conducted twice, one for forming the N-type heavily doped diffusions layer 13 and the other for activating the gate electrodes. After the first thermal treatment, the N-type heavily doped diffusion layers 13 are formed, then the thermal treatment for activating the N-type heavily doped diffusion layers 13 is conducted at temperature lower than that of the first thermal treatment and higher then that of the third thermal treatment, thus contemplating the further micro CMOS transistor.

(Second Embodiment)

A manufacturing method of a CMOS transistor according to the second embodiment is described next, with reference to drawings.

FIGS. 2(a)–(f) are sections of the essential part showing respective steps of the manufacturing method of a CMOS transistor of LDD structure having a single gate composed of polycide gate electrodes.

As shown in FIGS. 2(a), (b) and (c), the P-type diffusion layers 2, the N-type diffusion layers 3, the LOCOS oxide layer 4, the gate oxide layer 5, the polycrystalline silicon layer 6, the high-melting-point metal silicide layer 7 and the first insulating layer 8 are formed on the P-type silicon substrate 1, as well as in the first embodiment.

Then, as shown in FIG. 2(d), the second insulating layer 9 is deposited to 20 nm thickness.

Next, as shown in FIG. 2(e), after the formation of a set resist pattern (not shown), the N-type lightly doped diffusion layers 10 are formed on the P-type diffusion layers 2 to be the N-type channel MOS transistor in such a manner that phosphorus (P) ions of the N-type impurity are implanted, according to the ion implanting method, on the P-type diffusion layers 2 with 40 Kev acceleration energy and $4 \times 10^{13} cm^{-2}$ dose, using the resist pattern, the gate electrode and the first insulating layer 9 (perpendicular part) as a mask. Subsequently, the first thermal treatment for activation is conducted for 20 minutes at 900° C.

The thermal treatment at comparatively high temperature about 900° C. for 20 minutes should be avoided to conduct after forming the P-type lightly doped diffusion layers 11, the N-type heavily doped diffusion layers 13 and the P-type heavily doped diffusion layers 14 which require a shallow connection. Because, a temperature of thermal treatments after the thermal treatment is restricted to further lower temperature. By the thermal treatment for 20 minutes at comparatively high temperature of 900° C., the impurity of the N-type lightly doped diffusion layers 10 is activated to reduce a channel resistance and disordered crystal due to the ion implant is recovered, thus improving a mobility.

Further, by the thermal treatment for 20 minutes at comparatively high temperature of 900° C., the resistance of the gate electrode made of the polycrystalline silicon layer 6 and the high-melting-point metal silicide layer 7 is reduced, and depletion of the gate electrodes is prevented because of the activation of the gate impurity.

Then, after the set resist pattern (not shown) is formed, the P-type lightly doped diffusion layers 11 are formed, as shown in FIG. 2(f), in such a manner that boron (B) ions of the P-type impurity are implanted, according to the ion implanting method on the N-type diffusion layers 3 to be to the P-type channel MOS transistor with 20 Kev acceleration energy and $2 \times 10^{13} cm^{-2}$ dose, using the resist pattern, the gate electrode and the second insulating layer 9 (perpendicular part) as a mask.

Next, after depositing an oxide layer to 200 nm thickness on the surface of the second insulating layer 9, side walls 12 are formed at side surfaces of the gate electrodes, as shown in FIG. 2(g), by etching the oxide layer according to an etch back method. At this time, since the first insulating layer 8 is formed on the upper surface of the high-melting-point metal sllicide layer 7, ordinary etching over about 20% does not expose the upper surface thereof.

Then, the N-type heavily doped diffusion layers 13 are formed in such a manner that arsenic ions of the N-type impurity are implanted, according to the ion implanting method, to the N-type channel transistor region with 40 Kev acceleration energy and $5 \times 10^{15}$cm$^{-2}$ dose, using the gate electrode, the side walls 12 and the resist pattern (not shown) as a mask.

Subsequently, as shown in FIG. 2(h), the P-type heavily doped diffusion layers 14 are formed in such a manner that boron ions of the P-type impurity are implanted, according to the ion implanting method, to the P-type channel transistor region with 20 Kev acceleration energy and $5 \times 10^{15}$cm$^{-2}$ dose, using the gate electrode, the side walls 12 and the resist pattern (not shown) as a mask.

Then, as shown in FIG. 2(i), after forming the interposed insulating layer 15, the second thermal treatment is conducted at 850° C. for 30 minutes for activation and for planarizing the interposed insulating layer 15.

Finally, as shown in FIG. 2(j), the contact hole and the metal wiring pattern 16 are formed, thus obtaining the CMOS transistor of LDD structure having the polycide gate electrodes.

In order to activate the gate impurity to the degree of preventing the depletion of the gate electrodes, the thermal treatment must be conducted at comparatively high temperature about 900° C. However, with the polycide gate electrode, the thermal treatment under such a state where the high-melting-point metal silicide layer 7 is exposed causes abnormal oxidation. Consequently, the thermal treatment for activating the gate impurity must be conducted after forming the oxide layer to be the side walls 12 or after forming the interposed insulating layer 15 according to a conventional method.

In addition, since the diffusion coefficient of boron in the P-type lightly doped diffusion layers 11 and the P-type heavily doped diffusion layers 14 is large, the shallow connection cannot be formed by the thermal treatment at comparatively high temperature about 900° C., which declines the punch-through voltage between the source and the drain.

With a micro gate length of not more than half-micron, the punch-through voltage between the source and the drain is declined in the N-type heavily doped diffusion layers 13 to be the source or the drain of the N-channel transistor to which arsenic of comparatively small diffusion coefficient is doped, which makes impossible to manufacture a micro CMOS transistor.

In the second embodiment, since the thermal treatment at comparatively high temperature is conducted to the gate electrode after the second insulating film 9 is formed so as not to expose the high-melting-point metal silicide layer 7, the gate impurity is activated, while preventing the abnormal oxidation of the high-melting-point metal silicide layer 7.

Also, the thermal treatment at comparatively high temperature is conducted to the N-type lightly doped diffusion layers 10 to be the source or the drain of the N-channel transistor. Consequently, the channel resistance is lowered since the impurity in the N-type lightly doped diffusion layers 10 is fully activated. On the other hand, the second thermal treatment at comparatively low temperature is conducted for activating the P-type lightly doped diffusion layers 11, the N-type heavily doped diffusion layers 13 and the P-type heavily doped diffusion layers 14, thus contemplating the micro CMOS transistor.

As shown in FIG. 6 as a modified example of the second embodiment, it is possible that the first thermal treatment at comparatively high temperature is conducted for activating the gate impurity after the formation of the gate electrode and before the formation of the N-type lightly doped diffusion layers 10, the N-type lightly doped diffusion layers 10 are formed, then the second thermal treatment at slightly lower temperature than that of the first thermal treatment is conducted to the N-type lightly doped diffusion layers 10. In this case, the second thermal treatment in the second embodiment shall be a third thermal treatment.

With a further micro gate length, a further shallow connection cannot be formed in the N-type lightly doped diffusion layers 10 to be the source or the drain of the N-channel transistor, so that the punch-through voltage between the source and the drain is declined. Accordingly, the thermal treatment is conducted twice, one for forming the N-type lightly doped diffusion layers 10 and the other for activating the gate electrodes. The N-type lightly doped diffusion layers 11 are formed after the first thermal treatment and the thermal treatment for activating the N-type lightly doped diffusion layers 10 is conducted at the temperature lower than that of the first thermal treatment and higher than that of the third thermal treatment. Thus, a further micro CMOS transistor is contemplated.

(Third Embodiment)

Described blow is a manufacturing method of a CMOS transistor according to the third embodiment, with reference to drawings.

FIGS. 3(a)–(i) are sections of the essential part showing respective steps of the manufacturing method of a CMOS transistor having a single gate composed of polycide gate electrodes, in which the N-channel transistor is in LDD structure and the P-channel transistor is in single drain structure.

As shown in FIGS. 3(a), (b), (c), (d) and (e), the P-type diffusion layers 2, the N-type diffusion layers 3, the LOCOS oxide layer 4, the gate oxide layer 5, the polycrystalline silicon layer 6, the high-melting-point silicide layer 7, the first insulating layer 8, the second insulating layer 9 and the N-type lightly doped diffusion layers 10 are formed on the P-type silicon substrate 1, as well as in the second embodiment. Then, the first thermal treatment is conducted for 20 minutes at 900° C. for activation.

Then, after the oxide layer is deposited to 200 nm on the surface of the second insulating layer 9, the oxide layer is etched according to the etch back method to form the side walls 12 on side surfaces of the gate electrode, as shown in FIG. 3(f). At this time, since the first insulating layer 8 is formed on the upper surface of the high-melting-point metal silicide layer 7, ordinary etching over about 20% does not expose the upper surface thereof. Thereafter, the N-type heavily doped diffusion layers 13 are formed in such a manner that arsenic ions of the N-type impurity are implanted, according to the ion implanting method, to the N-type channel transistor region with 40 Kev acceleration energy and $5 \times 10^{15}$cm$^{-2}$ dose, using the gate electrode, the side walls 12 and the resist pattern (not shown) as a mask.

Then, as shown in FIG. 3(g), the P-type heavily doped diffusion layers 14 are formed in such a manner that boron ions of the P-type impurity are implanted, according to the ion implanting method, to the P-type channel transistor region with 20 Kev acceleration energy and $5 \times 10^{15}$cm$^{-2}$ dose, using the gate electrode, the side walls 12 and the resist pattern (not shown) as a mask.

Next, as shown in FIG. 3(h), after the formation of the interposed insulating layer 15, the second thermal treatment at 850° C. for 30 minutes are conducted for activation and for planarizing the interposed insulating layer 15. Thereafter, the contact hole and the metal wiring pattern 16 are formed to obtain the CMOS transistor shown in FIG. 3(i).

In order to activate the gate impurity to the degree of preventing the depletion of the gate electrodes, the thermal treatment must be conducted at comparatively high temperature about 900° C. However, with the polycide gate electrode, the thermal treatment under such a state where the high-melting-point metal silicide layer 7 is exposed causes abnormal oxidation. Consequently, the second thermal treatment for activation must be conducted after the formation of the oxide layer to be the side walls 12 or after the formation of the interposed insulating layer 15.

In addition, since the boron in the P-type heavily doped diffusion layers 14 has a large diffusion coefficient, the shallow connection cannot be formed by the thermal treatment at comparatively high temperature about 900° C., which declines the punch-through voltage between the source and the drain. Further, with a gate length of not more than a half micron, the punch-through voltage between the source and the drain is declined in the N-type heavily doped diffusion layers 13 to be the source or the drain of the N-channel transistor to which arsenic of comparatively small diffusion coefficient is doped, so that the micro CMOS transistor cannot be contemplated.

In the third embodiment, after the second insulating layer 9 is formed so as not to expose the high-melting-point metal silicide layer 7, the thermal treatment at comparatively high temperature is conducted to the gate electrodes. Thus, the gate impurity is activated, while preventing the abnormal oxidation of the high-melting-point metal silicide layer 7.

Since the P-type heavily doped diffusion layers 14 and the N-type heavily doped diffusion layers 13 are activated by the second thermal treatment at comparatively low temperature, the micro CMOS transistor is contemplated without declination of the punch-through voltage between the sources and the drains of the N-channel transistor and the P-channel transistor.

As shown in FIG. 6 as a modified example of the third embodiment, it is possible that the gate impurity is activated by the first thermal treatment at comparatively high temperature after the formation of the gate electrodes and before the formation of the N-type lightly doped diffusion layers 10, the N-type lightly doped diffusion layers 10 are formed, then the second thermal treatment at slightly lower temperature than that of the first thermal treatment is conducted to the N-type lightly doped diffusion layers 10. In this case, the second thermal treatment in the third embodiment shall be a third thermal treatment.

With a further micro gate length, a further shallow connection cannot be formed in the N-type lightly doped diffusion layers 10 to be the source or the drain of the N-channel transistor, which declines the punch-through voltage between the source and the drain. Accordingly, the thermal treatment is conducted twice, one for forming the N-type lightly doped diffusion layers 10 and the other for activating the gate electrodes. The N-type lightly doped diffusion layers 10 are formed after the first thermal treatment and the thermal treatment for activating the N-type lightly doped diffusion layers 10 is conducted at a temperature lower than that of the first thermal treatment and higher than that of the third thermal treatment, thus obtaining a further micro CMOS transistor.

(Fourth Embodiment)

Hereinafter discussed is about a manufacturing method of a CMOS transistor according to the fourth embodiment, with reference to drawings.

FIGS. 4(a)-(g) are sections of the essential part showing the respective steps of the manufacturing method of a CMOS transistor of single drain structure having a dual gate composed of the polycide gate electrodes.

As shown in FIG. (a), after the P-type diffusion layers 2 and the N-type diffusion layers 3 are formed on the P-type silicon substrate 1, the LOCOS oxide layer 4 of about 700 nm and the gate oxide layer 5 of about 20 nm are formed at respective set regions.

Then, as shown in FIG. 4(b), the polycrystalline silicon layer 6 is deposited to 250 nm thickness according to the low pressure CVD method. The high-melting-point metal silicide layer 7 such as tungsten silicide is deposited to 200 nm thickness on the polycrystalline silicon layer 6 according to, for example, the low pressure CVD method.

After forming the set resist pattern (not shown), the gate patterning is conducted using the dry etching technique, as shown in FIG. 4(c).

Then, as shown in FIG. 4(d), the Insulating layer 9 is deposited to 20 nm thickness. Thereafter, arsenic ions of the N-type impurity are implanted, according to the ion implanting method, to the N-type channel transistor region and the gate electrode with 40 Kev acceleration energy and $5 \times 10^{15} cm^{-2}$ dose, using the insulating layer 9 (perpendicular part) and the resist pattern (not shown) as a mask. Thus the N-type heavily doped diffusion layers 13 are formed and the N-type impurity is doped to the gate electrode of the N-channel transistor.

Subsequently, the first thermal treatment for activation is conducted for 20 minutes at 900° C. This thermal treatment for 20 minutes at comparatively high temperature about 900° C. cannot be conducted after the formation of the P-type heavily doped diffusion layers 14 which require a shallow connection. Because, the temperature of the thermal treatment is restricted to low when the thermal treatment is conducted after the formation of the P-type heavily doped diffusion layers 14.

When the thermal treatment at comparatively high temperature is conducted after the impurity of large diffusion coefficient, such as boron, is doped to the gate electrode of the P-channel transistor boron tunnels through the gate oxide layer to diffuse in the N-type diffusion layers 3, which causes change in threshold voltage. The activation by the thermal treatment for 20 minutes at comparatively high temperature about 900° C. is conducted no to the impurity doped to the gate electrode of the P-channel transistor but to only the impurity doped to the that of the N-channel transistor, so that the resistance of the gate electrode composed of the polycrystalline silicon layer 6 and the high-melting-point metal silicide layer 7 is reduced, while preventing the depletion of the gate electrode.

Then, as shown in FIG. 4(e), the P-type heavily doped diffusion layers 14 are formed in such a manner that boron ions of the P-type impurity are implanted, according to the ion implanting method, to the P-type channel transistor region and the gate electrode with 20 Kev acceleration energy and $5 \times 10^{15} cm^{-2}$ dose, using the insulating layer 9 (perpendicular part) and the resist pattern (not shown) as a mask.

Next, as shown in FIG. 4(f), after the formation of the interposed insulating layer 15, the second thermal treatment at 850° C. for 30 minutes is conducted for activation and for planarizing the interposed insulating layer 15.

Finally, as shown in FIG. 4(g), the contact hole and the metal wiring pattern 16 are formed to obtain the CMOS transistor of single drain structure having the dual gate composed of polycide gate electrodes.

Since the diffusion coefficient of boron which is doped to the P-type heavily doped diffusion layers 14 and the gate electrode of the P-type channel transistor is large, the shallow connection cannot be formed when the impurity doped into the gate electrode of the P-type channel transistor is activated by the temperature of the thermal treatment for activating the impurity doped to the N-type heavily doped diffusion layers 13 and the gate electrode of the N-channel transistor. Also, the gate impurity tunnels through the gate oxide layer of the P-type channel transistor to diffuse in the N-type diffusion layers 3.

In the fourth embodiment, however, the activation of the gate impurity of the P-type channel transistor by the second thermal treatment at comparatively low temperature makes possible to form the shallow channel, thus no gate impurity tunnels through the gate oxide layer. Thereby, obtainable is the CMOS transistor with micro dual gate in which the N-channel and P-channel transistors have excellent characteristic.

(Fifth Embodiment)

Description is made below about a manufacturing method of a CMOS transistor according to the fifth embodiment, with reference to drawings.

FIGS. 5(a)-(f) are sections of the essential part showing the respective steps of the manufacturing method of a CMOS transistor of LDD structure having a dual gate composed of polycide gate electrodes.

First, as shown in FIGS. (a), (b) and (c), after the P-type diffusion layers 2, the N-type diffusion layers 3, the LOCOS oxide layer 4, the gate oxide layer 5, the polycrystalline silicon layer 6 and the high-melting-point metal silicide layer 7 are formed on the P-type silicon substrate 1 respectively, the gate patterning is conducted using the dry etching technique.

Then, as shown in FIG. 5(d), the insulating layer 9 is deposited to 20 nm thickness.

Next, as shown in FIG. 5(e), after the formation of the set resist pattern (not shown), the N-type lightly doped diffusion layers 10 are formed on the P-type diffusion layers 2 in such a manner that phosphorus (P) ions of the N-type impurity are implanted, according to the ion implanting method, onto the P-type diffusion layers 2 to be the N-channel MOS transistor with 40 Kev acceleration energy and $4 \times 10^{13} cm^{-2}$ dose, using the insulating layer 9 (perpendicular part), the gate electrode and the resist pattern as a mask. Subsequently, the first thermal treatment for activation is conducted for 20 minutes at 900° C.

This thermal treatment for 20 minutes at comparatively high temperature about 90° C. should be avoided to conduct after the formation of the P-type lightly doped diffusion layers, the N-type heavily doped diffusion layers 13 and the P-type heavily doped diffusion layers 14 which require the shallow connection. Because, the temperature of the thermal treatment is restricted to low when the thermal treatment is conducted after the formation of these diffusion layers.

When the thermal treatment at comparatively high temperature is conducted after the impurity of large diffusion coefficient such as boron is doped to the gate electrode of the P-channel transistor boron tunnels through the gate oxide layer to diffuse into the N-type diffusion layers 3; which causes change in threshold voltage. Accordingly, the first thermal treatment is preferably conducted before the impurity is doped to the gate electrode of the P-channel transistor.

In addition, the thermal treatment for 20 minutes at comparatively high temperature about 900° C. activates the impurity of the N-type lightly doped diffusion layers 10 to reduce the channel resistance and to recover the disordered crystal due to ion implant, thus improving the mobility.

Then, as shown in FIG. 5(f), after the formation of the set resist pattern (not shown), the P-type lightly doped diffusion layers 11 are formed in such a manner that boron (B) ions of the P-type impurity are implanted, according to the ion implanting method, onto the N-type diffusion layers 3 to be the P-type channel MOS transistor with 20 Kev acceleration energy and $2 \times 10^{13} cm^{-2}$ dose, using the insulating layer 9 (perpendicular part), the gate electrode and the resist pattern as a mask.

Subsequently, after the oxide layer is deposited to 200 nm thickness on the surface of the insulating layer 9, the oxide layer is etched according to the etch back method to form the side walls 12 on side surfaces of the gate electrode, as shown in FIG. 5(g). Thereafter, the N-type heavily doped diffusion layers 13 are formed and the N-type impurity is doped to the gate electrode of the N-channel transistor in such a manner that arsenic ions of the N-type impurity is implanted, according to the ion implanting method, to the N-channel transistor region and the gate electrode with 40 Kev acceleration energy and $5 \times 10^{15} cm^{-2}$ dose, using the gate electrode, the insulating layer 9 (perpendicular part) and the resist pattern (not shown) as a mask.

Next, the second thermal treatment for 20 minutes at 875° C. is conducted for activation. This thermal treatment for 20 minutes at slightly high temperature of 875° C. cannot be conducted after forming the P-type heavily doped diffusion layers 14 which require the shallow connection. Because, the temperature of the thermal treatment is restricted to low when the thermal treatment is conducted after the formation of the P-type heavily doped diffusion layers 14.

When the thermal treatment at slightly high temperature is conducted after the impurity of large diffusion coefficient such as boron is doped into the gate electrode of the P-channel transistor, boron tunnels through the gate oxide layer to diffuse into the N-type diffusion layers 3, which causes the change in threshold voltage. In this embodiment, the activation by the thermal treatment for 20 minutes at slightly high temperature of 875° C. is conducted not to the impurity doped in the gate electrode of the P-channel transistor but to only the impurity doped in that of the N-channel transistor, so that the resistant of the gate electrode composed of the polycrystalline silicon layer 6 and the high-melting-point metal silicide layer 7 is surely reduced, preventing the depletion of the gate electrode.

Then, as shown in FIG. 5(h), the P-type heavily doped diffusion layers 14 are formed in such a manner that boron ions of the P-type impurity are implanted, according to the ion implanting method, to the P-channel MOS transistor region and the gate electrode with 20 Kev acceleration energy and $5 \times 10^{15} \text{cm}^{-2}$ dose, using the gate electrode, the insulating layer 9 (perpendicular part) and the resist pattern (not shown) as a mask.

Subsequently, as shown in FIG. 5(i), after the formation of the interposed insulating layer 15, the third thermal treatment is conducted for 30 minutes at 850° C. for activation and for planarizing the interposed insulating layer 15.

Finally, as shown in FIG. 5(j), the contact hole and the metal wiring pattern 16 are formed to obtain the CMOS transistor of single drain structure having the dual gate composed of the polycide gate electrodes.

Since the diffusion coefficient of the impurity (boron or the like) doped to the P-type heavily doped diffusion layers 14 and the gate electrode of the P-type channel transistor is large, the shallow connection cannot be formed when the impurity doped to the gate electrode of the P-type channel transistor is activated by the temperature of the thermal treatment for activating the impurity doped in the N-type heavily doped diffusion layers 13 and the gate electrode of the N-type channel transistor. As a result, the gate impurity tunnels through the oxide layer of the P-channel transistor to diffuse into the N-type diffusion layers 3. However, in the fifth embodiment, since the gate impurity of the P-channel transistor is activated by the second thermal treatment at slightly high temperature, the formation of the shallow connection is made possible. Thus, no gate impurity tunnels through the gate oxide layer. Thereby, the CMOS transistor having the micro dual gate in which the N-channel and the P-channel transistors have excellent characteristic is contemplated.

In first to fifth embodiments, the CMOS transistor has the polycide gate electrodes, however, the CMOS transistor may have generally used polysilicon gate electrodes, or may have silicide gate electrodes.

We claim:

1. A method of manufacturing a CMOS transistor, comprising the steps of:

forming gate electrodes of an N-channel transistor and a P-channel transistor on a semiconductor substrate with a gate insulating layer therebetween;

forming N-type lightly doped diffusion layers to be a source or a drain of the N-channel transistor, using the gate electrode of the N-channel transistor as a mask;

conducting a first thermal treatment to said gate electrodes and said N-type lightly doped diffusion layers of the N-channel transistor;

forming P-type lightly doped diffusion layers to be a source or a drain of the P-channel transistor, using the gate electrode of the P-channel transistor as a mask;

forming side walls on side surfaces of said gate electrodes of the N-channel transistor and the P-channel transistor;

forming N-type heavily doped diffusion layers to be a source or a drain of the N-channel transistor, using said gate electrode and said side walls of the N-channel transistor as a mask;

forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

2. The method of manufacturing a CMOS transistor according to claim 1, wherein said gate electrodes have a laminated structure composed of a polycrystalline silicon to which an N-type or P-type impurity is doped and a silicide of a high-melting-point metal which is laminated on the polycrystalline silicon.

3. A method of manufacturing a CMOS transistor, comprising the steps of:

depositing, after a polycrystalline silicon layer is deposited on a semiconductor substrate with a gate insulating layer therebetween, a high-melting-point metal silicide layer on said polycrystalline silicon layer;

forming, after a first insulating layer is deposited on said high-melting-point metal silicide layer, gate electrodes of an N-channel transistor and a P-channel transistor by dray-etching said high-melting-point metal silicide layer and said first insulating layer;

depositing a second insulating layer on an upper surface and both side surfaces of said gate electrodes;

forming N-type lightly doped diffusion layers to be a source or a drain of the N-channel transistor, using said gate electrode of the N-channel transistor as a mask;

conducting a first thermal treatment to said gate electrode and the N-type lightly doped diffusion layers;

forming P-type lightly doped diffusion layers to be a source or a drain of the P-channel transistor, using said gate electrode of the P-channel transistor as a mask;

forming side walls on side surfaces of said gate electrodes;

forming N-type heavily doped diffusion layers to be a source or a drain of the N-channel transistor, using said gate electrode and said side walls of the N-channel transistor as a mask;

forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

4. A method of manufacturing a CMOS transistor, comprising the steps of:

depositing, after a polycrystalline silicon layer is deposited on a semiconductor substrate with a gate insulating layer therebetween, a high-melting-point metal silicide layer on said polycrystalline silicon layer;

forming, after a first insulating layer is deposited on said high-melting-point metal sllicide layer, gate electrodes of an N-channel transistor and a P-channel transistor by dray-etching said high-melting-point metal silicide layer and said first insulating layer;

depositing a second insulating layer on an upper surface and both side surfaces of said gate electrodes;

forming N-type lightly doped diffusion layers to be a source or a drain of the N-channel transistor, using said gate electrode of the N-channel transistor as a mask;

conducting a first thermal treatment to said gate electrodes and said N-type lightly doped diffusion layers:

forming side walls on side surfaces of said gate electrodes;

forming N-type heavily doped diffusion layers to be a source or a drain of the N-channel transistor, using said gate electrode and said side walls of the N-channel transistor as a mask;

forming P-type heavily doped diffusion layers to be a source or a drain of the P-channel transistor, using said gate electrode and said side walls of the P-channel transistor as a mask; and conducting a second thermal treatment to said P-type lightly doped diffusion layers, said N-type heavily doped diffusion layers and said P-type heavily doped diffusion layers at a lower temperature than that of the first thermal treatment.

* * * * *